(12) United States Patent
Yamazaki et al.

(10) Patent No.: US 8,411,450 B2
(45) Date of Patent: Apr. 2, 2013

(54) ELECTRONIC DEVICE PACKAGE, MODULE, AND ELECTRONIC DEVICE

(75) Inventors: Takao Yamazaki, Tokyo (JP);
Yoshimichi Sogawa, Tokyo (JP);
Tomohiro Nishiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 376 days.

(21) Appl. No.: 12/161,825

(22) PCT Filed: Jan. 25, 2007

(86) PCT No.: PCT/JP2007/051203
§ 371 (c)(1),
(2), (4) Date: Jul. 23, 2008

(87) PCT Pub. No.: WO2007/086481
PCT Pub. Date: Aug. 2, 2007

(65) Prior Publication Data
US 2010/0246144 A1 Sep. 30, 2010

(30) Foreign Application Priority Data
Jan. 25, 2006 (JP) .................................. 2006-016138

(51) Int. Cl.
*H05K 1/00* (2006.01)
*H05K 1/03* (2006.01)
*H05K 7/00* (2006.01)
*H05K 1/14* (2006.01)
*H01L 23/02* (2006.01)
*H01L 23/34* (2006.01)

(52) U.S. Cl. ........ 361/749; 174/255; 257/686; 257/723; 361/735; 361/783; 361/784; 361/803

(58) Field of Classification Search .................. 361/749, 361/792–794, 767, 803, 735, 783–784; 257/698, 257/686, 700, 723; 174/254, 255
See application file for complete search history.

(56) References Cited

U.S. PATENT DOCUMENTS
(Continued)

FOREIGN PATENT DOCUMENTS
JP 2004-103843 4/2004
JP 2004-172322 6/2004
(Continued)

OTHER PUBLICATIONS
Machine Translation of JP 2004172322 A: Hajiyama I et al., Semiconductor Package and Stacked Semiconductor.*

*Primary Examiner* — Timothy Thompson
*Assistant Examiner* — Sherman Ng
(74) *Attorney, Agent, or Firm* — Scully, Scott, Murphy & Presser PC

(57) ABSTRACT

The present invention is directed to provide a semiconductor package and the like realizing reduced manufacturing cost and improved reliability by enhancing a ground line and/or a power supply line. A semiconductor package 50 includes: a semiconductor device 1 including a circuit face on which an external electrode is formed; an insertion substrate 2 forming a housing part in which the semiconductor device 1 is disposed; and an interposer substrate 5 including a wiring pattern 7 and whose both ends are bent along the insertion substrate 2. The insertion substrate 2 is made of a conductive material and is electrically connected to a ground line or a power supply line in the wiring pattern 7 in the interposer substrate 5.

26 Claims, 17 Drawing Sheets

U.S. PATENT DOCUMENTS

| | | | | |
|---|---|---|---|---|
| 5,027,253 A | * | 6/1991 | Lauffer et al. | 361/321.4 |
| 5,144,746 A | * | 9/1992 | McDavid | 29/830 |
| 5,332,921 A | * | 7/1994 | Dousen et al. | 257/685 |
| 5,394,303 A | * | 2/1995 | Yamaji | 361/749 |
| 5,798,567 A | * | 8/1998 | Kelly et al. | 257/723 |
| 6,080,931 A | * | 6/2000 | Park et al. | 174/534 |
| 6,300,679 B1 | * | 10/2001 | Mukerji et al. | 257/738 |
| 6,351,028 B1 | * | 2/2002 | Akram | 257/686 |
| 6,646,335 B2 | * | 11/2003 | Emoto | 257/686 |
| 6,768,191 B2 | * | 7/2004 | Wennemuth et al. | 257/686 |
| 6,919,626 B2 | * | 7/2005 | Burns | 257/686 |
| 2002/0053726 A1 | * | 5/2002 | Mikubo et al. | 257/685 |
| 2003/0168725 A1 | * | 9/2003 | Warner et al. | 257/686 |
| 2004/0018658 A1 | * | 1/2004 | Mano | 438/106 |
| 2004/0080040 A1 | * | 4/2004 | Dotta et al. | 257/698 |
| 2005/0041402 A1 | * | 2/2005 | Cady et al. | 361/749 |
| 2006/0049495 A1 | * | 3/2006 | Hazeyama et al. | 257/678 |
| 2006/0050496 A1 | * | 3/2006 | Goodwin | 361/803 |
| 2006/0050497 A1 | * | 3/2006 | Goodwin | 361/803 |

FOREIGN PATENT DOCUMENTS

| | | | |
|---|---|---|---|
| JP | 2004172322 A | * | 6/2004 |
| JP | 2004172322 A | * | 6/2004 |
| JP | 2006-13029 | | 1/2006 |

* cited by examiner

F I G. 1
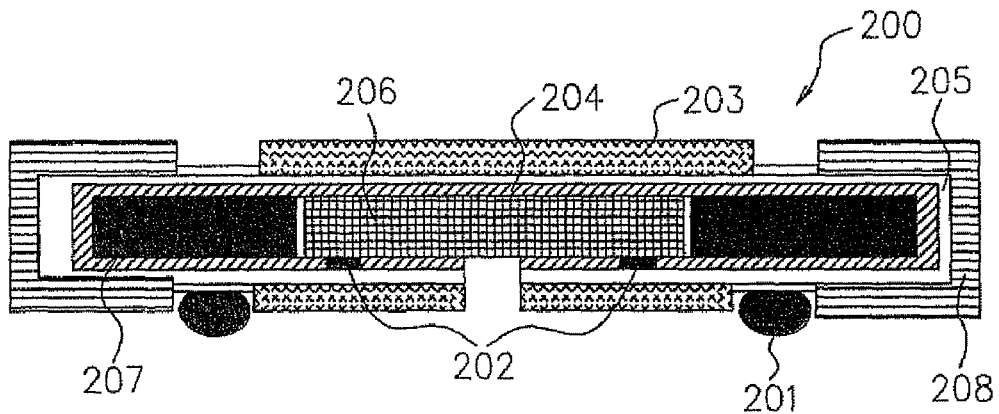
F I G. 2
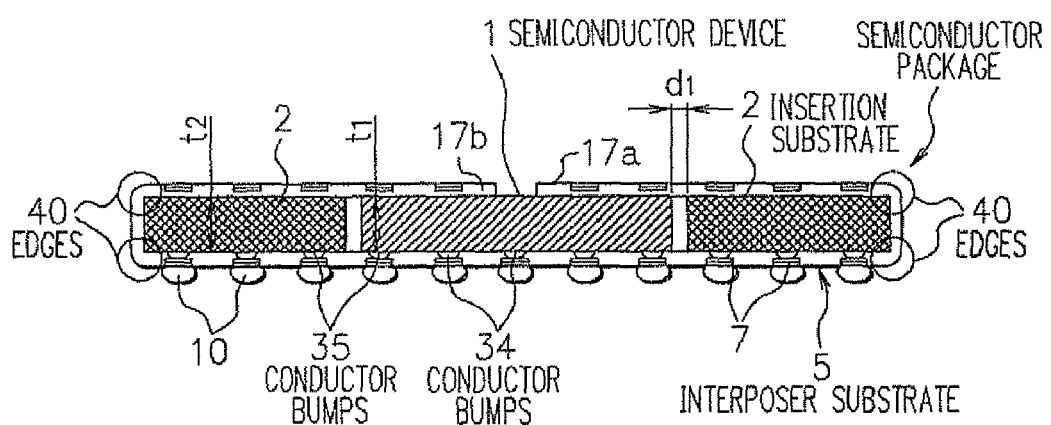
F I G. 3
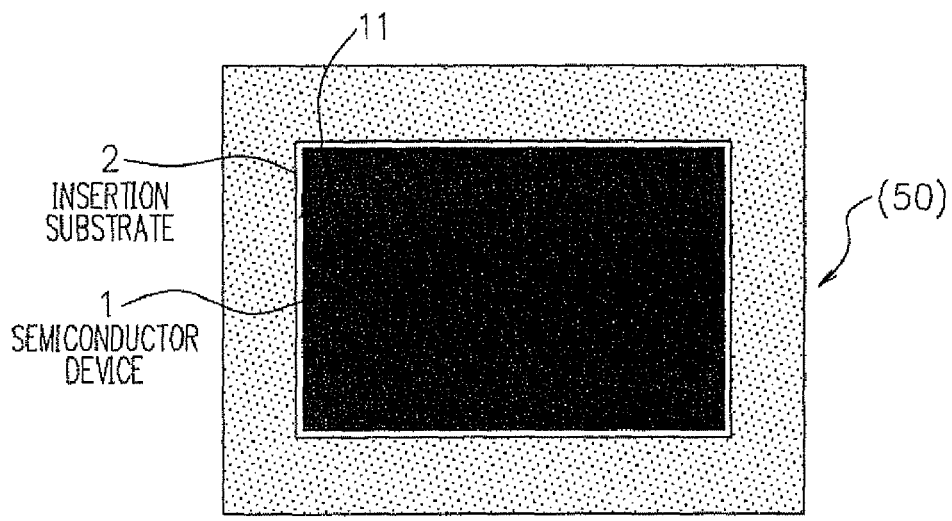

F I G. 6
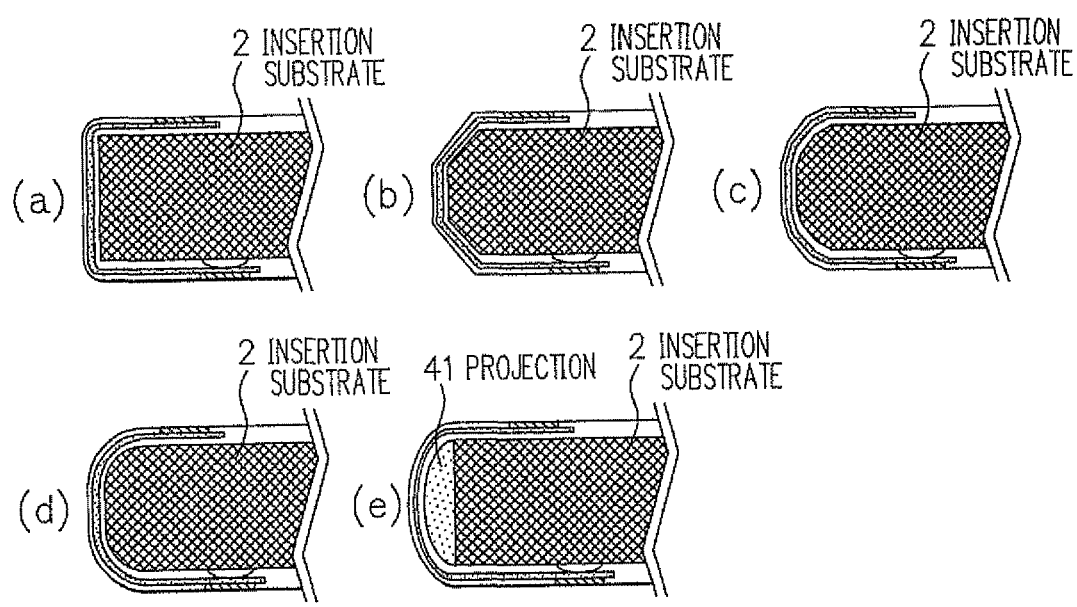

F I G. 11
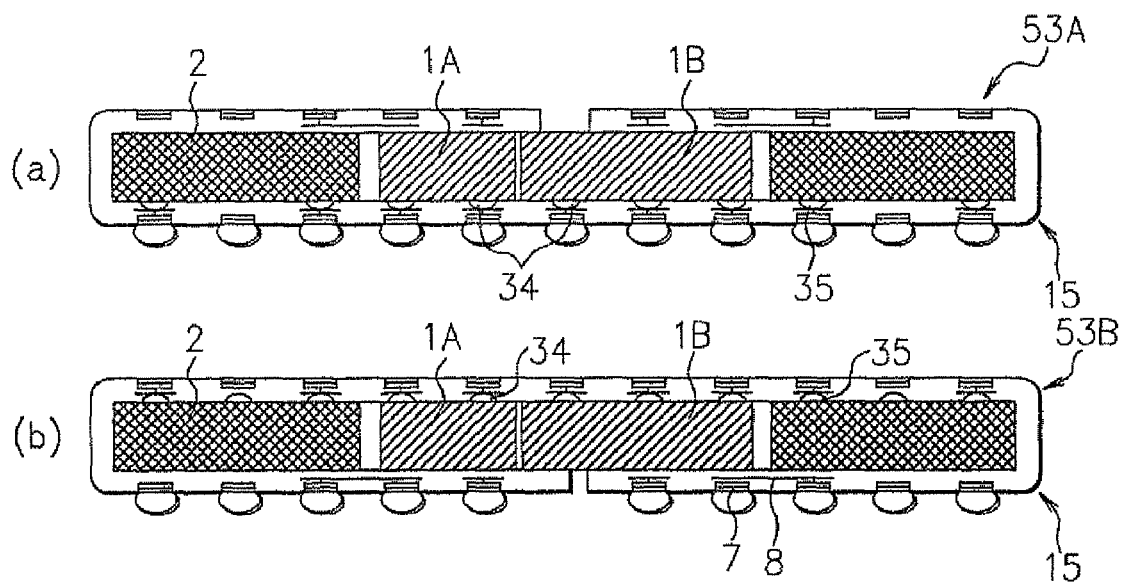
F I G. 12
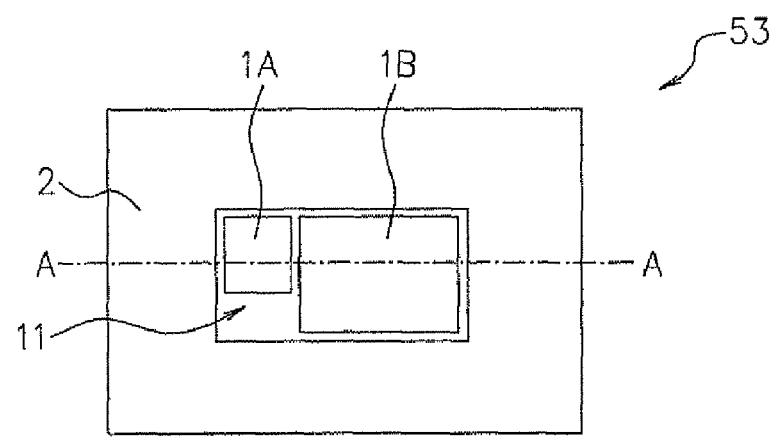

F I G. 14
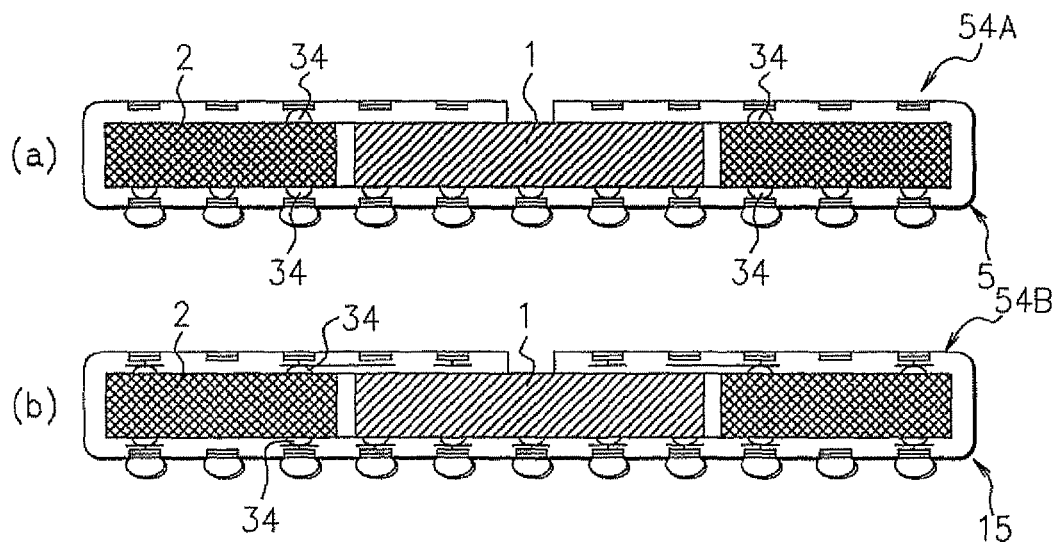
F I G. 15
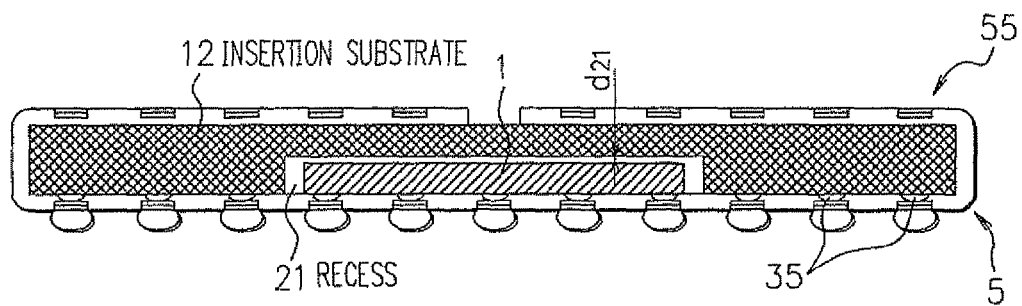

F I G. 16
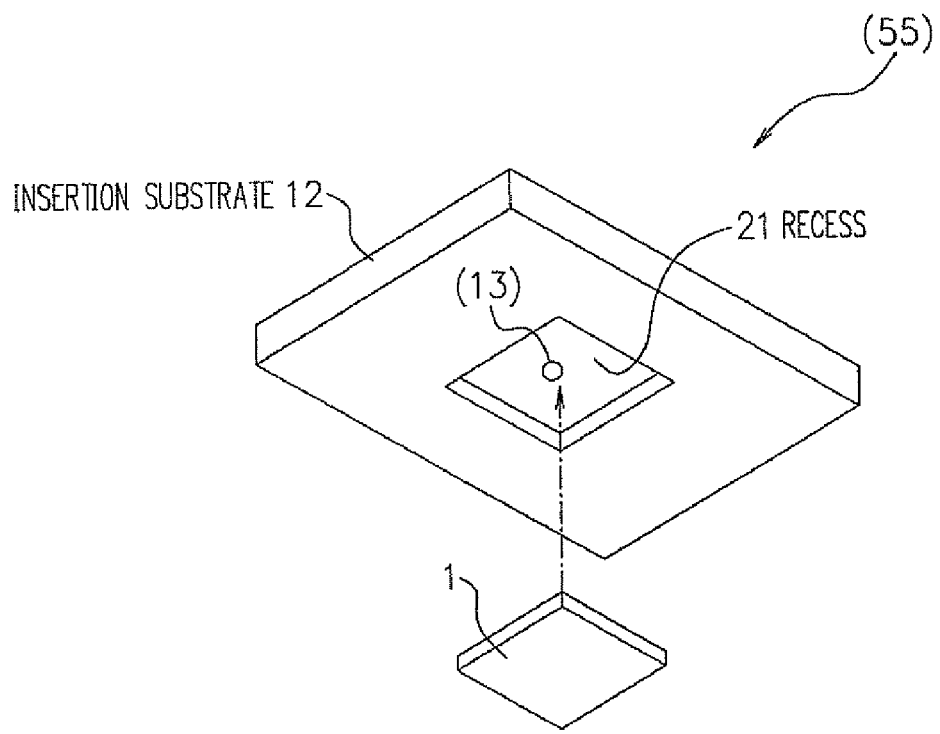
F I G. 17
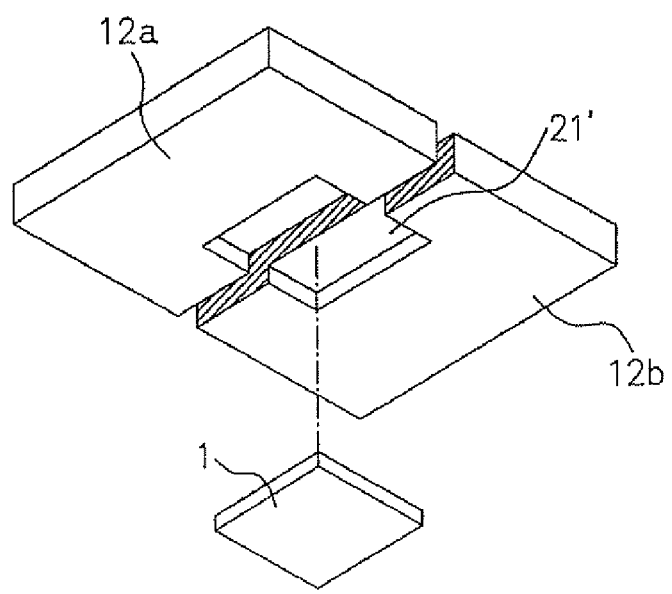

F I G. 20
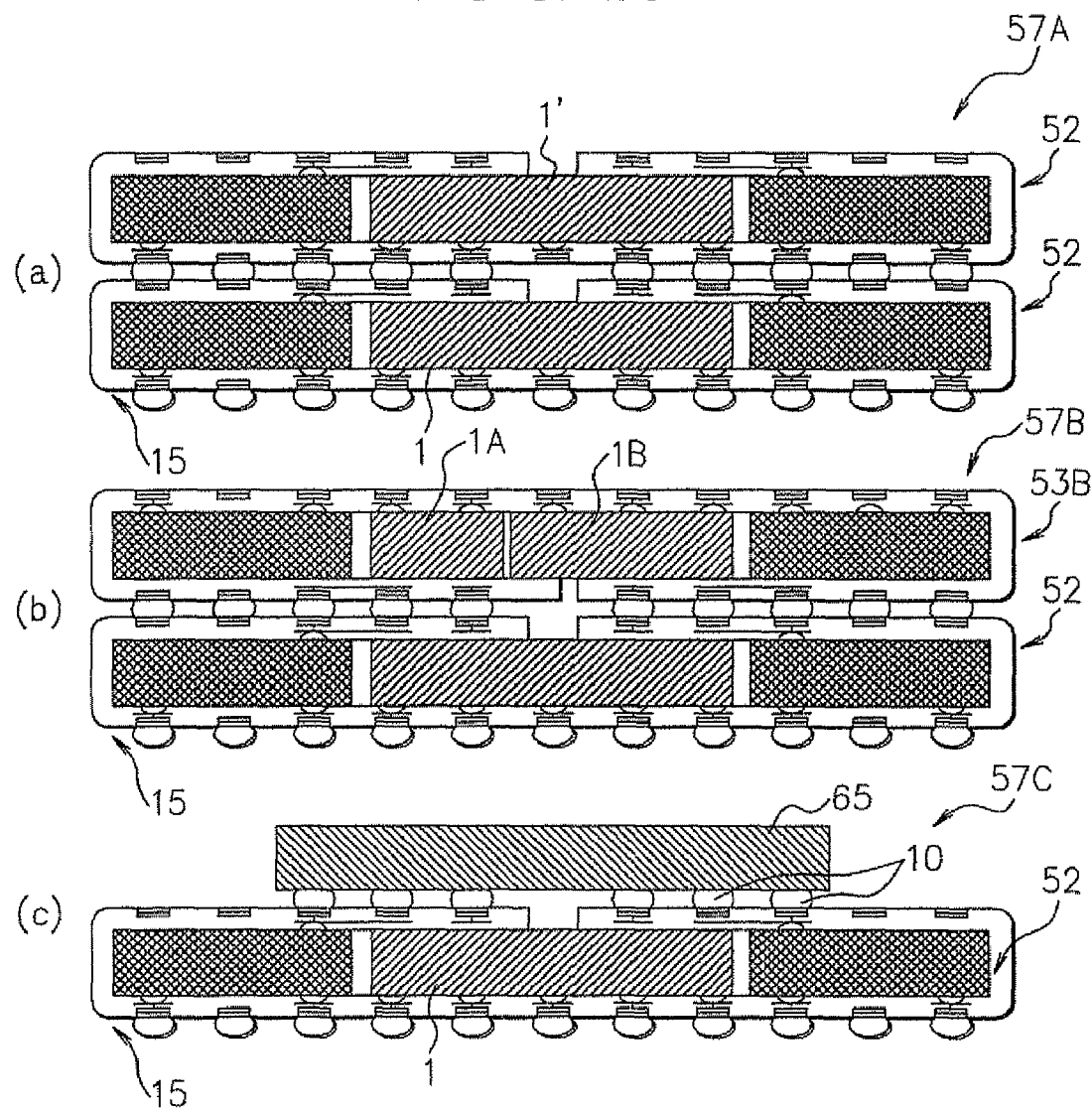

F I G. 21
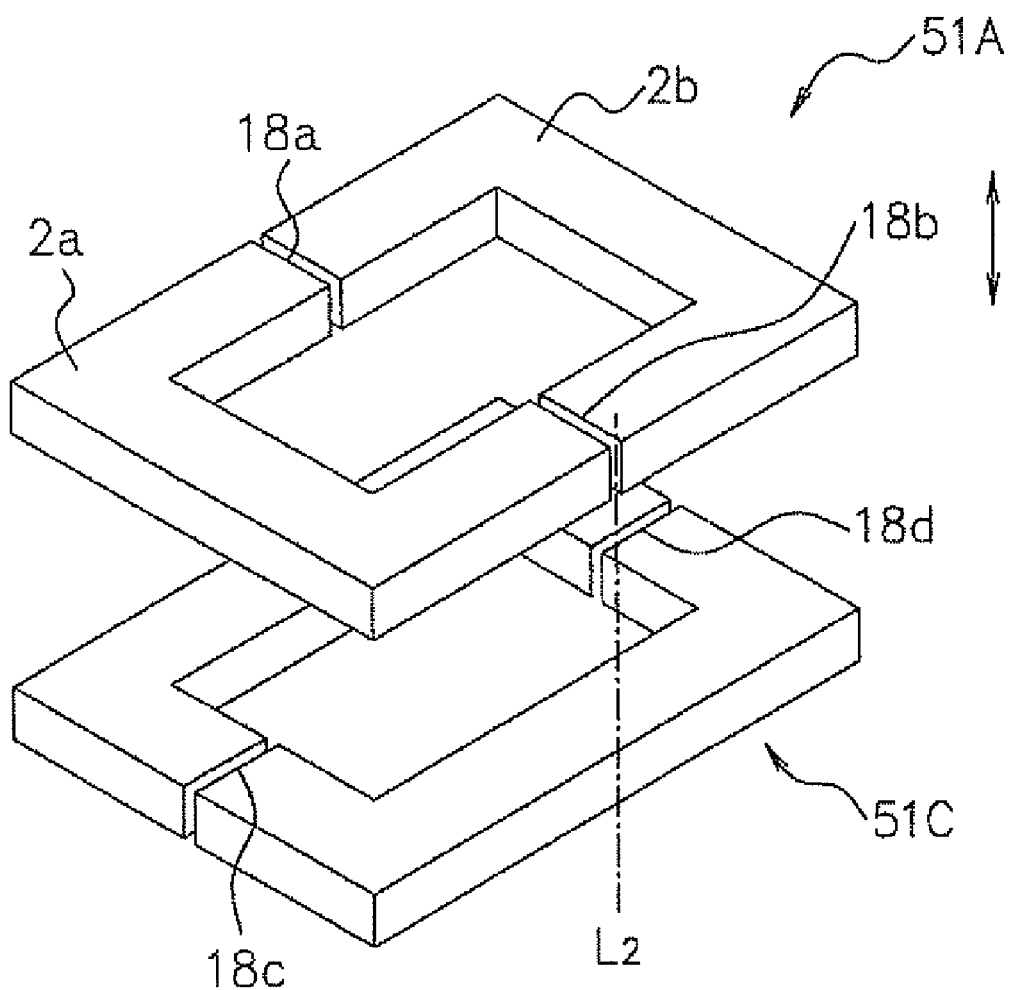

F I G. 25
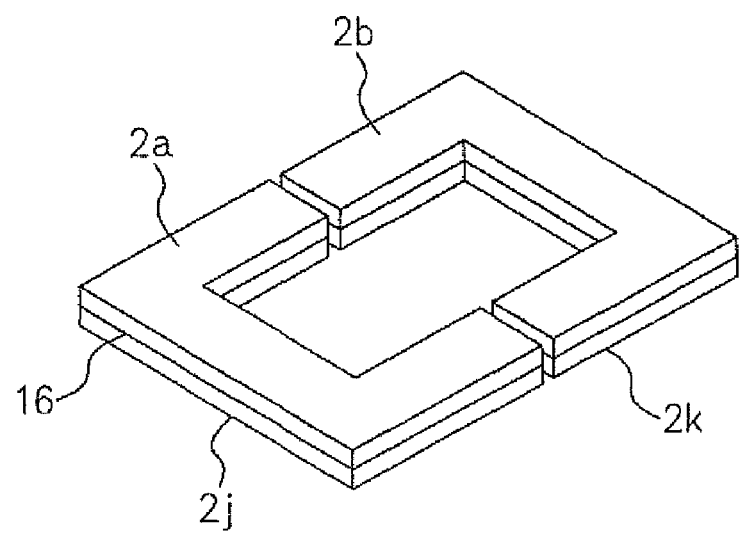
F I G. 26
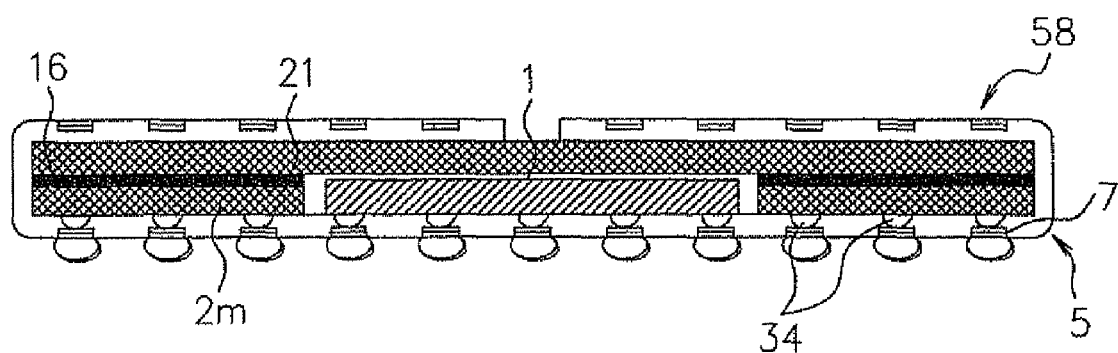

F I G. 27
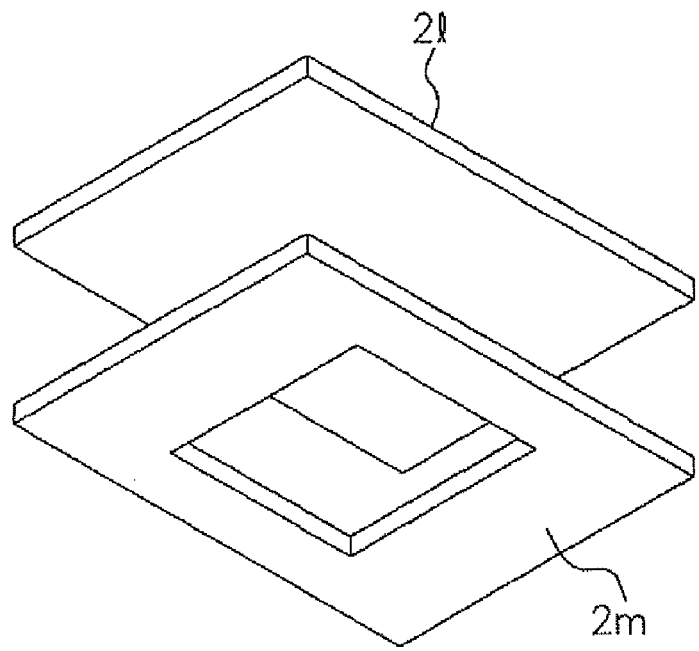
F I G. 28
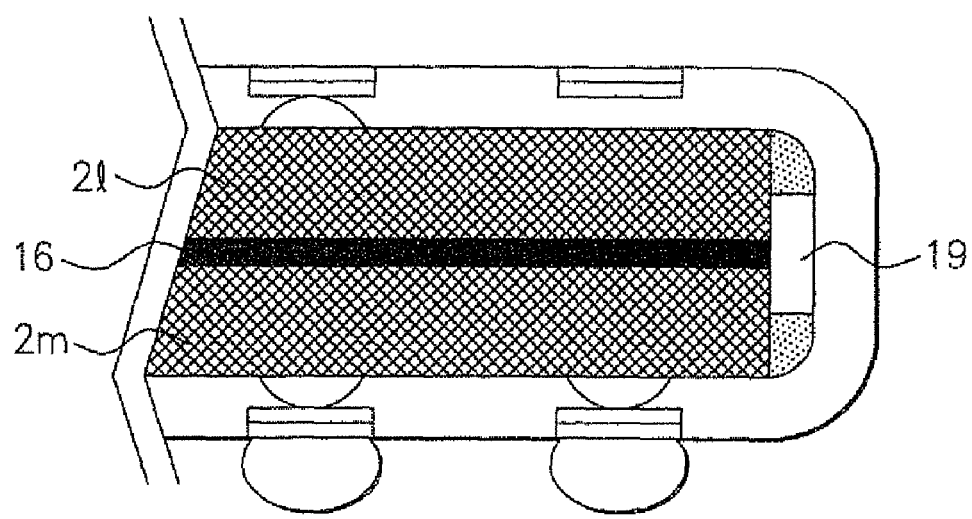

ELECTRONIC DEVICE PACKAGE, MODULE, AND ELECTRONIC DEVICE

TECHNICAL FIELD

The present invention relates to an electronic device package and, more particularly, to an electronic device package technique using an electronic device that operates at high speed.

BACKGROUND ART

FIG. 1 is a cross section showing a semiconductor package described in Patent Document 1. A semiconductor package 200 shown in FIG. 1 includes a semiconductor device 206, a flexible substrate 208 (also called "interposer substrate") disposed so as to surround the semiconductor device 206, and at least one inserted plate 207 disposed around the semiconductor device.

On the under face side in the diagram of the semiconductor device 206, a circuit face is formed. An external electrode is formed on the circuit face. The inserted plate 207 is used mainly as a spacer, is made of, for example, a metal material, formed in thickness equal to that of the semiconductor device 206.

On the flexible substrate 208, a wiring pattern 205 connected to the external electrode of the semiconductor device 206 is formed. One side or both sides of the wiring pattern 205 is/are covered with thermoplastic insulating resin layers 203 and 204.

Concretely, the semiconductor device 206 and the wiring pattern 205 are electrically connected to each other via conductor bumps 202. On the under face side of the flexible substrate 208, the resin layer 203 is partially removed, thereby providing parts (electrode pad) from which the wiring pattern 205 is exposed. Solder balls 201 are disposed in the parts. The semiconductor package 200 constructed as described above is mounted on a secondary mounting board (for example, mother board) via the solder balls 201.

The configuration that the pitch of the conductor bumps 202 on the side of the semiconductor device 206 is wider than the pitch of the solder balls 201 is also called a "fan-out type" and has the following advantages. Since the technique of narrowing the pitch of external terminals on the secondary mounting board side does not sufficiently catch up with a semiconductor device shrinking technique (outer-size reducing technique) at present, the pitch of external terminals on the secondary mounting board side is wider than that on the semiconductor device side. Therefore, in order to compensate the difference in the pitches, the flexible substrate 208 is used to increase the pitch of the external terminals.

In the package structure of the fan-out type as shown in FIG. 1, external terminals (electrode pads) are formed on the top and under faces of the package. Consequently, it is also possible to stack the package on another package to obtain three-dimensional mounting.

Patent Document 1: Japanese Patent Application Laid-open No. 2004-172322

DISCLOSURE OF THE INVENTION

Problems to be Solved by the Invention

Many conventional semiconductor packages of FIG. 1 use semiconductor devices such as a CPU (Central Processing Unit) and a DRAM (Dynamic Random Access Memory) performing high-speed operation. In the case where a device performing high-speed operation is used, a problem of noise such as crosstalk has to be solved. Consequently, a countermeasure of enhancing a ground line of the wiring pattern 205 of the flexible substrate 208 (increasing the area of the pattern) is often taken. On the other hand, a DRAM requested to perform high-speed operation has to be operated at low voltage in order to decrease the heat generation amount. In this case, a countermeasure of enhancing a power supply line (increasing the area of the pattern) is often taken.

In any case, it is necessary to enhance the ground line or the power supply line of the wiring pattern by increasing the area. Conventionally, to realize it, the flexible substrate 208 in which the wiring pattern 205 is multilayered is used and almost of the entire one layer in the wiring pattern is used as the ground line or the like. However, in such a countermeasure, since the flexible substrate 208 of the multilayer type is used, there is a problem such that the manufacturing cost of the semiconductor package is high.

The above problem can occur similarly in a configuration that an electronic device such as an SAW device (Surface Acoustic Wave device) is disposed in place of the semiconductor device.

The present invention has been achieved in view of the above problem and an object of the invention is to provide an electronic device package realizing reduced manufacturing cost, high electric operation reliability, and excellent mechanical reliability, a module on which the electronic device package is mounted, and an electronic device.

Means for Solving the Problems and Effect of the Means

To solve the problem, an electronic device package of the present invention includes: an electronic device including a circuit face on which an external electrode is formed; at least one insertion substrate forming a housing part in which the electronic device is disposed; and a flexible substrate including a wiring pattern electrically connected to the electronic device and at least a part of which is bent along the insertion substrate and/or the electronic device. At least one of the insertion substrates is made of a conductive material and is electrically connected to a ground line or a power supply line of the wiring pattern.

With the configuration, the insertion substrate is connected to the ground line or the power supply line, thereby enabling the ground line or the power supply line to be enhanced. Conventionally, in the case of enhancing the ground line or the like, a method of increasing the number of wiring layers in the flexible substrate and using, for example, one of the wiring layers for enhancing the ground line is employed. According to the present invention, the ground line or the like is enhanced by the insertion substrate, so that it is unnecessary to increase the number of wiring layers in the flexible substrate. However, it does not mean that such a multilayer flexible substrate cannot be used in the present invention. It is also possible to use a multilayer flexible substrate and enhance the ground line or the like by the insertion substrate as described above.

In the electronic device package of the present invention, the insertion substrate is used as a part of the ground line and/or the power supply line, thereby enhancing the ground line and/or the power supply line. Therefore, it becomes unnecessary to increase the number of wiring layers in the flexible substrate as in the conventional technique, so that the high-speed electronic device package can be realized at lower cost. Normally, the volume (sectional area) of the insertion substrate is sufficiently larger than that of a wiring pattern in the flexible substrate. Therefore, it is advantageous to use such an insertion substrate as a part of the ground line and/or the power supply line from the viewpoint of enhancing the ground line and/or the power supply line more effectively.

In the insertion substrate used for the electronic device package of the present invention, at least a part corresponding to the wiring pattern bent part may be formed in a polygonal shape or a circular shape. With the configuration, the stress concentration degree of the bent part in the flexible substrate is decreased, and mechanical reliability also in the thickness of the thermoplastic insulating resin layer can be improved. In other words, required reliability can be satisfied also in the thickness of a thinner thermoplastic insulating resin layer, and it leads to a thinner package and lower cost.

When the bent part is formed in a polygonal shape or a circular shape, the curvature of the wiring pattern in the flexible substrate is lowered. It also produces an effect such that occurrence of reflection of an electric signal generated in the case where a wire is bent is suppressed, and a strength loss in signal transmission is suppressed. In other words, a signal can be transmitted with higher strength to the back side. Considering the fact that the higher the frequency becomes, the larger the loss in the signal strength becomes, and the harder the stable operation becomes, it can be said that the structure of the invention is advantageous for high-speed operation.

BEST MODE FOR CARRYING OUT THE INVENTION

Exemplary embodiments of the present invention will be described in detail hereinbelow with reference to the drawings. In the following embodiments, a semiconductor package as an example of the electronic device package of the present invention will be described.

First Exemplary Embodiment

FIG. 2 is a vertical section of a semiconductor package of a first exemplary embodiment. FIG. 3 is a top view of the semiconductor package of FIG. 2 but an interposer substrate (flexible substrate) is not shown.

As shown in FIG. 2, a semiconductor package 50 of the present embodiment includes a semiconductor device (electronic device) 1, an insertion substrate 2 disposed around the semiconductor device 1, and a flexible interposer substrate 5 disposed so as to surround the semiconductor device 1 and the insertion substrate 2. Basically, a known member can be used as each of the members of the semiconductor device 1, the insertion substrate 2, and the interposer substrate 5. A main feature of the present invention is that, as will be described later, a wiring pattern (a ground line or a power supply line) of the interposer substrate 5 is electrically connected to the insertion substrate 2.

The semiconductor device 1 is constructed by, for example, a CPU, a DRAM, and the like. In the present embodiment, as an example, only one semiconductor device 1 is disposed as shown in FIG. 3. Although not limited, a circuit face of the semiconductor device 1 is on the under face side in the diagram, and conductor bumps 34 are disposed on the circuit face.

In an electronic device package according to the present invention, in place of semiconductor devices such as a CPU and a DRAM, electronic devices such as a SAW device (Surface Acoustic Wave device), a gyro element, a crystal resonator, and a chip capacitor may be mounted.

The insertion substrate 2 is, as shown in FIG. 3, a flat plate formed in a frame shape surrounding the semiconductor device 1 in the present embodiment. Specifically, an opening 11 as a housing part is formed in a center portion of the insertion substrate 2, and the semiconductor device 1 is disposed in the opening 11. The material of the insertion substrate 2 is not particularly limited as long as it is conductive. Preferably, the material is a metal with low electric resistance such as Cu, Al, or stainless steel. Further, among the metals, as the material of an insertion substrate for enhancing a power supply line and a ground line, Cu with the lowest electric resistance is preferable. On the other hand, in the case where it is desired to enhance particularly electro-magnetic shielding performance of the ground line, a Cu—Ni alloy with relatively low resistance and excellent electromagnetic wave shielding performance or the like is preferable. The material of the insertion substrate is not limited to the above-described materials.

As shown in FIG. 2, a thickness $t_2$ of the insertion substrate 2 is the same as a thickness $t_1$ of the semiconductor device 1. Although the thicknesses do not have to be the same, the difference between the thicknesses $t_1$ and $t_2$ is, preferably, 50 μm or less and, more preferably, 20 μm or less for the following reason. In the present embodiment, the interposer substrate 5 is adhered onto the insertion substrate 2 and the semiconductor device 1. If the thickness difference between the insertion substrate 2 and the semiconductor device 1 is large, there is the possibility that adhesion reliability of the interposer substrate 5 around the boundary deteriorates. That is, in consideration of adhesion of the interposer substrate 5, the top face of the insertion substrate and that of the semiconductor device are preferably flush with each other. When the difference in thickness (step) is 50 μm or less, the interposer substrate can be excellently adhered. Further, when the step is 20 μm or less, peeling or the like of the adhered interposer substrate 5 is further suppressed. Thus, a semiconductor package with improved long-term reliability is obtained.

To make the thickness of the insertion substrate 2 and that of the semiconductor device 1 the same, the following method may be employed. First, the semiconductor device 1 and the insertion substrate 2 are fixed on the interposer substrate 5. In this state, the semiconductor device 1 and the insertion substrate 2 are simultaneously ground by using a grinder or the like to make the thicknesses of the members the same. After that, it is sufficient to bend the interposer substrate 5 and adhere the interposer substrate 5 onto the semiconductor device 1 and the insertion substrate 2.

Referring again to FIG. 3, the contour size of the insertion substrate 2 (the size of the insertion substrate in top plan) is set so as to be adjusted to (so as to be the same as) the size of a contact area on a mother board on which the semiconductor package 50 is mounted. In the semiconductor package 50 of the present embodiment, solder balls 10 for connection to the outside are disposed in almost the entire area in the under face in the diagram, and the face serves as a contact face.

The interposer substrate 5 includes a single-layer wiring pattern 7. In the present embodiment, the interposer substrate 5 is bent in two places, and the inner surface of the interposer substrate on the bent side is adhered to the outer surface of each of the inserted substrate 2 and the semiconductor device 1. The wiring pattern 7 is made of, for example, Cu, Al, or the like and may have a thickness of a few μm to tens μm (for example, about 5 to 18 μm). The wiring pattern 7 may be a wire of a sintered body formed by supplying a conductive paste made of conductive metal powders of Ag, Cu, or the like to a wiring part and heat-hardening the conductive paste.

More specifically, as shown in FIG. 4, the interposer substrate 5 is obtained by forming the wiring pattern 7 on the inside using a thermoplastic resin 6 with insulating property and flexibility as a base material. As the thermoplastic resin 6, a material obtained by compounding silicone-modified polyimide and flexible epoxy resin or the like can be used. In the case of the material, by heating the material to 150° C. to 200° C., the elasticity modulus decreases to tens MPa or less (elasticity modulus of about 1 GPa at room temperature). Consequently, the interposer substrate 5 can be easily bent, and damage to the bent conductor wiring pattern 7 is small.

In the case of the material, by heating the material, the adhesion force is expressed. Consequently, adhesion between the interposer substrate 5 and the semiconductor device 1 and the like can be easily performed. The material expressing the adhesion force does not construct the entire thermoplastic resin 6 of the interposer substrate 5 but may be provided only in parts which are in contact with the semiconductor device 1 and/or the insertion substrate 2.

As shown in FIG. 4, the conductor bumps 34 and 35 are in contact with the wiring pattern 7 from one face side, and the solder balls 10 are in contact with the face on the other side via electrode pads 9. The conductor bumps 34 and 35 will be described again by referring to FIG. 2. The conductor bumps 34 are used to connect the semiconductor device 1 and the wiring pattern 7, and the conductor bumps 35 are used to connect the insertion substrate 2 and the wiring pattern 7. Although the conductor bumps 34 and 35 are indicated by different reference numerals, it is intended to discriminate the disposing positions of the conductor bumps and it is not intended to show that the materials and shapes are different.

The insertion substrate 2 and the wiring pattern 7 are electrically connected to each other via the conductor bumps 35, so that the insertion substrate 2 is conducted to the ground (or the power supply). Whether the insertion substrate 2 is connected to the ground line or the power supply line is properly selected according to the characteristics and the like of the semiconductor device 1 used. For example, in the case where the semiconductor device 1 performs high-frequency operation (as an example, 0.5 GHz or higher), enhancement of the ground line is necessary. On the other hand, in the case where it is desired to construct a semiconductor package operating with low voltage, enhancement of the power supply line is necessary. In the present embodiment, an example of enhancing one of the ground line or the power supply line will be described. In the second and subsequent exemplary embodiments, an example of enhancing both of the ground line and the power supply line simultaneously will be also described.

Naturally, in the case of connecting the insertion substrate 2 to the ground side, it is sufficient to connect the ground line in the wiring pattern 7 and the insertion substrate 2. In the case of connecting the insertion substrate 2 to the power supply side, it is sufficient to connect the power supply line and the insertion substrate 2. Alternately, a solder made of Au or Sn—Ag may be formed in the ground line or the power supply line as a part to be connected.

As described above, in the present embodiment, by connecting the insertion substrate 2 to the pattern on the ground side and connecting the insertion substrate 2 to the ground, enhancement of the ground line can be realized. Such a configuration has the following advantages as compared with the conventional measure of preparing the interposer substrate 5 in which the wiring pattern is multilayered and using almost entire one layer in the multiple layers as the ground line. Since the sectional area (in some cases, also the area) of the insertion substrate 2 is much larger than that of the wiring pattern formed in the interposer substrate 5, according to the present embodiment, the ground line can be enhanced more effectively than the conventional countermeasure.

Similarly, when the insertion substrate 2 is connected to the power supply line, enhancement of the power supply line can be realized. In this case, in the configuration of the present embodiment, the sectional area or the like of the insertion substrate 2 is much larger than that of the power supply line in the interposer substrate. Consequently, in a manner similar to the above, the power supply line can be enhanced more efficiently.

In the insertion substrate 2, as shown in FIG. 5 and FIG. 6, by processing or forming projections corresponding to bent parts in the interposer substrate 5, improvement in reliability and improvement in high-speed transmission of the electric signal can be realized. The parts corresponding to the bent parts refer to edges 40 shown in FIG. 2. The edge processing examples will be described by using FIGS. 5A and 6B. In the insertion substrate 2, the edges of four sides forming the bent parts in the interposer substrate 5 are ground at an angle of about 45°. In such a manner, the angle of the edge is increased from 90° to 135° and concentration of the stress is reduced, thereby enabling occurrence of a crack to be suppressed. In addition, reflection of a signal of the bent wire is reduced in the case of performing an electric operation. Since a loss in the signal strength is reduced, higher-speed operation can be realized.

Although the edge is ground at the angle of 45° C. in FIG. 6B, by forming multiple angles as shown in FIG. 6C and forming the edge in an R face as shown in FIG. 6D, the curvature is further reduced, and reliability and high-speed operation characteristic can be further improved. In addition to the process on the insertion substrate 2, as shown in FIG. 6E, a projection made of a resin, solder, or the like may be formed at the end face of the insertion substrate 2.

The explanation on the conductor bumps 34 and 35 will be added. Any of the conductor bumps 34 and 35 may be an Au-stuffed bump or made of a solder (Sn—Pb, Sn—Ag, Sn—Ag—Cu, Sn—Bi, Sn—Zn, or the like), or flip-chip bonding can be also used. In the interposer substrate 5 (refer to FIG. 4), it is sufficient to form the electrode pads 9 by a thin film made of a material such as Au, Ni/Au, Pd, Sn, Sn—Ag, Sn—Ag—Cu, or Sn—Pb. The thin film can be formed by, for example, plating, sputtering, or the like.

Desirably, as a distance $d_1$ (the distance between the outer periphery of the device and the inner periphery of the opening) shown in FIG. 2, for example, 20 μm or longer is assured. To increase the area of the insertion substrate 2 as much as possible, preferably, the distance $d_1$ is as short as possible, and the gap is as narrow as possible. However, when the gap is too narrow, there is the possibility that the semiconductor device 1 and the insertion substrate 2 interfere with each other due to variations in the dimensions of the semiconductor device 1 and the opening 11.

Second Exemplary Embodiment

In the first exemplary embodiment, the insertion substrate 2 made of a single member and formed in a frame shape is used. However, the present invention is not limited to the first exemplary embodiment. A configuration as shown in FIG. 7 may be employed. FIG. 7 is a top view of a semiconductor package according to a second exemplary embodiment, in which the interposer substrate is not shown. Configuration examples of the present invention will be described below taking the second to eighth exemplary embodiments as examples. Naturally, it is also possible to properly combine the configurations described in the exemplary embodiments as necessary.

A semiconductor package 51A shown in FIG. 7A is different from the foregoing embodiment in the point that a pair of insertion substrates 2a and 2b each having a U shape and bilaterally symmetrical are used. The insertion substrates 2a and 2b are disposed so as to face each other and surround the semiconductor device 1. The insertion substrate (2a as an example) as one of the insertion substrates is connected to the ground line in the interposer substrate, and the other insertion substrate (2b as an example) is connected to the power supply line. As described above, in the present invention, one of the insertion substrates and the other insertion substrate may be connected to patterns of different polarities. In this case, both enhancement of the ground line and the power supply line are realized.

Both of the insertion substrates 2a and 2b may be connected to the ground (or the power supply). In this case, how to electrically connect the insertion substrates can be properly changed.

FIG. 7B shows a semiconductor package 51B using four insertion substrates 2e to 2h each formed in an L shape. In this case, for example, the two insertion substrates 2e and 2f are connected to the ground line, another insertion substrate 2g is connected to the power supply line, and the remaining insertion substrate 2h is not connected to any patterns.

The insertion substrate 2h which is not connected to the power supply line or the ground line functions as a spacer and, in addition, also functions as a member for heat dissipation, electrostatic prevention, strength reinforcement, or planarization improvement.

As another example, FIG. 8A shows a semiconductor package 51D in which six insertion substrates 2i, 2j, and 2j' are disposed around the semiconductor device 1. Although not limited, the insertion substrates 2j and 2j' have the same shape, and the insertion substrates 2i are formed slightly longer than the insertion substrates 2j and 2j'. Each of the insertion substrates 2j is connected to the ground line, each of the insertion substrates 2j' is connected to the power supply line, and the remaining substrates 2i are not connected to any lines.

FIG. 8B shows another configuration example. A semiconductor package 51E includes the insertion substrates 2j and 2j' having the same shape as that in the above configuration, and L-shaped insertion substrates 2k. The substrate 2j is connected to the ground line, the substrate 2j' is connected to the power supply line, and the remaining substrates 2k are not connected to any lines.

The semiconductor package as shown in FIG. 7A can be further changed and may have a configuration as shown in FIG. 7. A semiconductor package 51A' in FIG. 9 is similar to the above configuration in the point that the pair of insertion substrates 2a' and 2b' is used but is different in the point that two insertion substrates are left-right asymmetrical. As a result, (two) gaps 18a and 18b created between ends of the insertion substrates are not aligned on a straight line (straight line $L_1$) in plan view. Since the positions of the gaps 18a and 18b are deviated from each other, for example, even if an external force in the direction of the straight light $L_1$ is applied, deformation in the entire package is suppressed.

Third Exemplary Embodiment

In the first exemplary embodiment, the single-layer interposer substrate 5 is used. However, the present invention is not limited to the first exemplary embodiment. A multilayer interposer substrate 15 may be employed as shown in FIG. 10. A semiconductor package 52 in FIG. 10 is obtained by changing only the interposer substrate 5 in the package of the first exemplary embodiment, and the other structure is the same as that in the first exemplary embodiment.

The interposer substrate 15 is a two-layer-type wiring substrate including a second wiring pattern 8 in addition to the first wiring pattern 7. Even in the case of using the interposing substrate 15 of the two-layer type (or three or more layer type), by connecting the ground line (or the power supply line) of the wiring patterns 7 and 8 to the insertion substrate 2, enhancement of the ground line (or enhancement of the power supply line) is realized in a manner similar to the first exemplary embodiment.

In the present embodiment, more specifically, the interposer substrate 15 is used in the case of using a logic LSI as the semiconductor device 1 for the following reason. In the case of a logic LSI, generally, the number of pins is large, so that the wiring pitch is narrow. In a single-layer wiring, the wire may not be drawn. As an example, in the case where the semiconductor device 1 includes super many pins more than 500 pins, in the case where it is difficult to draw a wire even with two-layer wire to realize an SiP (System in Package), and the like, a multilayer interposer substrate of three or more layers is suitable.

Even in the case where the multilayer interposer substrate 15 is used as described above, the effects of the present invention can be obtained in a manner similar to the above embodiment. Specifically, in the case where the present invention is not applied, one layer in the multilayer wiring pattern has to be assigned for enhancement of the ground (or power supply) line. According to the present invention, it is unnecessary to increase the number of layers in the wiring pattern. It means that an interposer substrate of the smaller number of layers can be used. As a result, the manufacturing cost of the semiconductor package can be reduced.

Fourth Exemplary Embodiment

Though the above exemplary embodiment has the configuration in which only one semiconductor device 1 is disposed in a housing, the present invention is not limited to the configuration, but a plurality of semiconductor devices may be disposed as shown in FIG. 11. The top view of the semiconductor device of FIG. 11 (the interposer substrate is not shown) is shown in FIG. 11. FIG. 11 is a cross section taken along cut line A-A of FIG. 12. Each of semiconductor packages 53A and 53B shown in FIGS. 11A and 11B is obtained by changing the number of semiconductor devices and the wiring form, and the other structure is the same as that of the third exemplary embodiment.

As shown in FIG. 12, each of the semiconductor packages 53A and 53B includes a plurality of (for example, two) semiconductor devices 1A and 1B disposed in the opening 11 in the insertion substrate 2. The semiconductor devices 1A and 1B are disposed so as to be adhered to the inner face of the interposer substrate and arranged side by side flatways.

In the semiconductor package 53A (refer to FIG. 11A), the circuit face of each of the semiconductor devices faces downward in the diagram, so that a wiring form of so-called face-down mounting is obtained. In this case, the semiconductor device 1 and the wiring pattern of the interposer substrate are connected to each other via the conductor bumps 34 on the under face side of the semiconductor package. On the other hand, the semiconductor package 53B (refer to FIG. 11B) includes a wiring form of face-up mounting. The circuit face of each of the semiconductor devices faces upward in the diagram. The semiconductor device and the wiring pattern of the interposer substrate are connected to each other via the conduction bumps 34 on the top face side of the package.

It is not always necessary to connect the insertion substrate 2 and the ground line (or the power supply line) on the under face side of the package. As obvious from FIG. 11B, the insertion substrate 2 and the ground line (or the power supply line) may be connected to each other on the top face side of the package via the conductor bumps 35.

Also in the configuration in which the plurality of semiconductor devices 1A and 1B are disposed, the effect obtained by connecting the insertion substrate 2 to the ground line (or the power supply line) can be obtained in a manner similar to the foregoing embodiment.

Naturally, the configuration in which a plurality of semiconductor devices are disposed and the configuration in which a plurality of insertion substrates are used as described in the second exemplary embodiment can be combined. This configuration will be described below with reference to FIG. 13. In FIG. 12, the opening 11 is formed in a rectangular shape. In each of configurations of FIG. 13, an opening 11A has a shape corresponding to the plane shape of the semiconductor devices 1A and 1B, that is, a shape in which the gap around the semiconductor device is almost constant. With such a configuration, the area of the insertion substrates becomes larger, so that effects of the invention can be obtained more effectively.

The configuration of FIG. 13A corresponds to that shown in FIG. 7A and includes a pair of insertion substrates 2a and 2b each having an almost U shape. The configuration of FIG. 13B corresponds to that shown in FIG. 7B and includes four insertion substrates 2e to 2h each having an almost L shape. The configuration of FIG. 13C corresponds to that shown in FIG. 9 and includes a pair of insertion substrates 2a' and 2b' and gaps 18a and 18b which are provided in a deviated state so as not to be aligned on a straight line.

Fifth Exemplary Embodiment

In the foregoing embodiments, the substrate 2 and the ground line (or the power supply line) are connected only on one of the faces of the insertion substrate. The invention is not limited to the configuration but a configuration as shown in FIG. 14 may be employed.

In a semiconductor package 54A of FIG. 14A, the insertion substrate and the ground line (or the power supply line) are connected to each other via the conductor bumps 34 on both of the top and under faces of the insertion substrate 2. The other structure is the same as that of the first exemplary embodiment. A semiconductor package 54B in FIG. 14B is similar to the semiconductor package 54A and is different from the package 54A in only the point that the multilayer interposer substrate 15 is used in place of the single-layer interposer substrate 5.

In the case where the insertion substrate 2 and the ground line (or power supply line) are connected to each other on both sides of the insertion substrate as described above, the following advantages can be obtained. Since the number of connection points increases, electric resistance decreases. Even if poor connection occurs in some places, an advantage such that the life time until occurrence of disconnection increases can be also obtained.

The package manufacturing method of the fifth exemplary embodiment is different from that of the semiconductor packages of the first to fourth exemplary embodiments in the point that the conductor bumps 34 are formed on the both sides of the insertion substrate 2. The conductor bump 34 is, preferably, an Au bump with an acute tip. The interposer substrate 5 is bent, the bent side is connected to the top face in the diagram of the insertion substrate 2 and, simultaneously, the Au-stuffed bump (34) is connected to the ground line (or the power supply line) of the interposer substrate 5. When a thermoplastic resin is used for the resin of the interposer substrate 5, the Au bump and Au or solder are connected by breaking the thermoplastic resin which is softened by heating, and the thermoplastic resin and the insertion substrate 2 (and the semiconductor device) can be adhered to each other.

Sixth Exemplary Embodiment

In the first exemplary embodiment (refer to FIG. 2), a device is disposed in the opening 11 formed in the insertion substrate 2. The present invention is not limited to the configuration. A device may be disposed in a recess (cavity) 21 as shown in FIG. 15. The configuration will be described below with reference to FIGS. 15 and 16. FIG. 15 is a cross section of a semiconductor package. FIG. 16 is a perspective view of the insertion substrate 12 and the semiconductor device 1 used for the package in FIG. 15 viewed from the under face side. The structure other than the insertion substrate 12 is the same as that in the first exemplary embodiment.

As shown in FIGS. 15 and 16, the recess 21 is formed in the under face (one side) of the insertion substrate 12 and its planar shape is rectangular as an example. Such an insertion substrate 12 is disposed side so as to cover the semiconductor device 1 while provided the recess 21 on the under face. In other words, the semiconductor device 1 is covered and shielded with the insertion substrate 12.

The insertion substrate 12 is connected to the ground line (or the power supply line) via the conductor bumps 35, thereby realizing enhancement of the ground line (or enhancement of the power supply line) in a manner similar to the first exemplary embodiment. In particular, in the present embodiment, the semiconductor device 1 is covered with the insertion substrate 12, so that the insertion substrate 12 functions as a protection member. As a result, the semiconductor device 1 is not easily damaged. For example, even if a mechanical external force is applied at the time of secondary mounting, there is an advantage that damaging on the semiconductor device 1 is suppressed. Further, in the present embodiment, by connecting the insertion substrate 12 to the ground line to earth, the insertion substrate 12 can be also used as a shield member. As a result, the performance of the semiconductor package can be improved.

A distance $d_{21}$ shown in FIG. 15 (the distance between the top face of the device and the top face of the recess) is preferable to ensure, for example, 20 μm or longer. When the distance is too short, there is the possibility that the semiconductor device 1 and the insertion substrate 12 interfere with each other due to variations in the dimensions of the recess 21 and variations in the thickness of the semiconductor device. A technique of filling the gap between the recess 21 and the semiconductor device 1 with an adhesive will be described later. In this case, the distance $d_{21}$ may be set to, for example, about 25 to 30 μm in consideration of the amount of the adhesive filled.

Naturally, the configuration of the present embodiment and the configuration of any of the foregoing embodiments can be also combined. For example, as shown in FIG. 17, a single recess 21' (a recess-shaped housing part) may be formed with cavities formed in two insertion substrates 12a and 12b.

Seventh Exemplary Embodiment

Although a plurality of insertion substrates are used in the second exemplary embodiment (refer to, for example, FIG. 5), in the case of this configuration, the following configuration may be applied.

A semiconductor package 56 of the present embodiment shown in FIG. 18 has a configuration based on the configuration of the second exemplary embodiment, in which decoupling capacitors 19 are disposed between the insertion substrates 2a and 2b. Concretely, the capacitors 19 are disposed so as to cross over the gaps 18a and 18b.

The number of the decoupling capacitors 19 may be one but FIG. 18 show an example where a plurality of decoupling capacitors 19 are disposed. One of electrodes of each of the capacitors 19 is connected to the ground-side insertion substrate 2a, and the other electrode is connected to the power-supply-side insertion substrate 2b. For adhesion between the electrodes of the capacitor and the insertion substrate, for example, solder made of a material such as Sn—Pb, Sn—Ag, Sn—Ag—Cu, Sn—Bi, Sn—Zn, or the like can be used.

As the decoupling capacitor, a chip capacitor (with a thickness of 100 μm or more) or a thin film capacitor (with a thickness less than 100 μm) may be used. The capacitor 19 in FIG. 18 is a thin film capacitor whose thickness is, for example, about the same as that of the interposer substrate 5. Since the thin film capacitor is relatively thin, even if the thin film capacitor is attached as it is on the top face of the insertion substrates 2a and 2b, the top part of the capacitor 19 is not largely projected from the surface of the interposer substrate 5.

On the other hand, as shown in FIG. 19, in the case of using a chip capacitor 19' which is relatively thick, for example, a step 23 is formed in each of the insertion substrates 22a and 22b, and the capacitor 19' may be disposed in the steps 23. With such a configuration, the top face of the final package becomes flat and, in addition, the package is miniaturized.

Although not particularly shown in FIG. 18, a barrier metal such as Ni/Au is formed on the surface (particularly, on an area where the capacitor is to be mounted) of the insertion substrate by electrolytic plating or non-electrolytic plating in order to prevent diffusion of solder.

As a semiconductor package manufacturing method of the present embodiment, for example, it is sufficient to mount the decoupling capacitor 19 before or after the interposer substrate is bent and adhered. Concretely, solder paste is applied to the external electrode of the decoupling capacitor and, after that, the capacitor is temporarily adhered onto the insertion substrate by using a known surface mounter. After that, it is sufficient to melt the solder by using a reflow furnace to finally connect the capacitor and the insertion substrate.

For example, in a semiconductor package using a CPU and a DRAM operating at 0.5 GHz or higher, a problem of an instantaneous voltage drop such as switching noise may occur. To prevent it, in the configuration of the present embodiment, the decoupling capacitors 19 are disposed between the insertion substrates. The decoupling capacitors may be disposed, not on the semiconductor package side, but on the mother board side on which the decoupling capacitors are mounted. In the configuration of the present embodiment, it is unnecessary to dispose capacitors on the mother board side, so that the mounting area on the mother board side can be reduced. Obviously, it does not mean to exclude a configuration in which the capacitors are disposed on the mother board side. For example, decoupling capacitors may be disposed on both of the semiconductor package side and the mother board side. It is more effective to dispose the decoupling capacitor closer to an LSI. As compared with the case where the capacitor is disposed on the mother board side, the mode of FIG. 18 according to the present invention is more preferable.

Eighth Exemplary Embodiment

In a single semiconductor package of the present invention, terminals for electric connection can be formed on the top and under faces of the package. Consequently, some semiconductor packages are stacked and used preferably. The configuration will be described below with reference to FIG. 20.

A stacked semiconductor package 57A in FIG. 20A is obtained by stacking two semiconductor packages 52 of the second exemplary embodiment three-dimensionally. One and the other packages are electrically connected to each other via the solder balls 10. Semiconductor packages having the same configuration may be stacked as described above. Although not limited, in the configuration of FIG. 20A, the semiconductor devices 1 and 1' are different from each other. For example, one of them is a CPU and the other is a memory.

A stacked semiconductor package 57B in FIG. 20B is obtained by stacking the semiconductor package 53B of the fourth exemplary embodiment on the semiconductor package 52 of the second exemplary embodiment. In such a manner, a semiconductor package of any of the foregoing embodiments and a semiconductor package of another embodiment may be stacked.

A stacked semiconductor package 57B in FIG. 20C is obtained by stacking a semiconductor package 65 having a configuration different from that of the present invention on the semiconductor package 52 of the second exemplary embodiment. The semiconductor package 65 may have a conventional configuration, for example, like the configuration disclosed in the patent document 1.

Although FIG. 20 show the examples of stacking two packages, the number of packages is not limited to two. Obviously, three or more packages may be stacked. FIG. 20A and the like show a three-dimensional package obtained by combining different kinds of semiconductor devices 1. Obviously, the invention can be also applied to an example of combining the same semiconductor devices. In each of FIG. 20, the package 52 of the second exemplary embodiment is provided. The configuration is just an example. Any of the packages in the foregoing embodiments may be provided.

In the case of stacking some semiconductor packages as in the present embodiment, particularly, in the case of stacking semiconductor packages each including a plurality of insertion substrates of the second exemplary embodiment type as shown in FIG. 7, a stacking form as shown in FIG. 21 may be employed.

As shown in FIG. 21, one semiconductor package 51A includes a pair of insertion substrates 2a and 2b like in the second exemplary embodiment, and the other semiconductor package 51C similarly includes a pair of insertion substrate. The feature point of the configuration of FIG. 21 is that the gap 18b (18a) in the one semiconductor package 51A is in a direction different from that of the gap 18c (18d) in the other semiconductor package 51C in the stack direction. That is, the gap 18b (18a) and the gap 18c (18d) are configured not to align in the position of a reference line $L_2$ extending in the stack direction. By forming the gap in one of the semiconductor packages and the gap in the other semiconductor package that are adjacent to each other in the stack direction in different directions, rigidity of the package as a whole is increased.

A more detailed configuration of the interposer substrate which has not been described in detail above will be explained below with reference to FIG. 22. FIG. 22 are diagrams showing an example of the more detailed configuration of the interposer substrate 5 and for explaining an example of the interposer substrate manufacturing method. In the interposer substrate 5 in FIG. 22D, a first resin layer 6 and a second resin layer 6' are adhered to each other, and the wiring pattern 7 is formed therebetween.

As shown in FIG. 22A, a member (also called "single-sided tape substrate") in which a film member (7) made of, for example, Cu is formed on the first resin layer 6 is prepared. As shown in FIG. 22B, by patterning and removing a part of the film member (7), a wiring pattern 7 is formed.

As shown in FIG. 22C, holes 6h are formed in positions corresponding to the wiring pattern 7 in the first resin layer 6 (to be accurate, the positions of external terminals). The hole forming process can be executed by laser process using, for example, a UV-YAG laser, a carbon dioxide gas laser, an excimer laser, or the like. In the case where the resin layer 6 is made of a photosensitive resin, a photolithography process can be used.

As shown in FIG. 22D, the second resin layer 6' is adhered, and the electrode pads 9 are formed on the surface of the wiring pattern 7. In such a manner, the single-layer interposer substrate 5 is manufactured.

The conductor bumps 34 and 35 (refer to FIGS. 2 and 4) are connected on the top face side in the diagram of the wiring pattern 7, to achieve this, holes 6h' may be formed in advance as shown in FIG. 22D. The hole forming process can be also executed by means similar to the above.

In the case where the conductor bumps 34 and 35 are Au stuffed bumps, it is sufficient to form an Au film (as a base, Ni is deposited to a thickness of 0.1 to 1 µm as a barrier layer) on the surface of the wiring pattern 7. For the film formation, plating or sputtering can be used. It is also possible to form a solder made of Sn—Pb, Sn—Ag, Sn—Ag—Cu, Sn—Bi, Sn—Zn, or the like with a thickness of 3 µm to 10 µm by plating. In the case where Au plating is formed on the wiring pattern 7, the Au stuffed bumps and the Au film are connected to each other by thermo-compression bonding, ultrasonic bonding or the like. In the case of forming a solder made of SnAg or the like on the wiring pattern 7, the Au stuffed bumps and the solder are melted and bonded to each other by thermo-compression bonding and reflow.

In the case where the resin layer 6' is made of a thermoplastic resin, it is not always necessary to form holes. For example, when a configuration such that the resin layer are opened by being pressed by the conductor bumps 34 and 35 is employed, the bumps and the wiring pattern come into contact with each other and are electrically connected. In this case, the bumps are sealed by the resin layer 6' at the same time with opening of the holes, so that a special sealing process is not required.

Although the present invention has been described above by using the exemplary embodiments as examples, the present invention can be also properly modified. Improvement in reliability and high-speed signal transmission by the process on the edges of the insertion substrate 2 has been described only in the first exemplary embodiment but, obviously, it can be applied to the other embodiments.

For example, each of the interposer substrates 5 and 15 is bent in two places in any of the foregoing embodiments. However, the present invention is not limited to the configuration. For example, the interposer substrate may be bent in three sides out of four sides of the outer periphery of the insertion substrate 2 (refer to FIG. 3), or in all of four sides. The interposer substrate may be bent only in one side out of the four sides.

In the foregoing embodiments, for example, the interposer substrate 5 bent as shown in FIG. 2 is bonded to both of the semiconductor device 1 and the insertion substrate 2. The present invention is not limited to the configuration. The interposer substrate 5 may be bonded only onto the insertion substrate 2. For example, in the case of the configuration as shown in FIG. 23, a part of the interposer substrate 5 is bent along the outer surface of the semiconductor device 1. The interposer substrate 5 is not always bent only along the insertion substrate 2 but may be bent along the semiconductor device 2.

As shown in FIG. 2, in the foregoing embodiment, the insertion substrate 2 and the wiring pattern (ground line or power supply line) are electrically connected to each other via the conductor bumps 35. However, the present invention is not limited to the present embodiment. For example, a conductive adhesive or the like can be also used. For example, in the case of using the interposer substrate 5 in which a part of the wiring pattern is exposed and the exposed part is a ground line (or power supply line), a conductive adhesive may be applied so as to fill the gap between the exposed part and the insertion substrate.

In order to increase reliability in fixing of the semiconductor device 1 and the insertion substrate, for example, as shown in FIG. 24, an insulating adhesive may be applied between the insertion substrates 2a and 2b and the semiconductor device 1 or between the insertion substrates 2a and 2b (refer to an area C).

Alternately, in the case where the insertion substrate is connected only to the ground, a conductive adhesive may be used to make the potential on the back side (the face where the circuit face is not formed) and the side faces of the chip equal to the ground.

For example, in the case of the insertion substrate 12 shown in FIGS. 15 and 16, an injection hole 13 may be also formed in the top face of the recess 21 to inject an adhesive for fixing from the injection hole 13. Concretely, a semiconductor device is disposed on the interposer substrate 5 and the insertion substrate 12 is disposed so as to cover the semiconductor device. An adhesive is injected from the injection hole 13 to fix the insertion substrate 12 and the semiconductor device 1. The present invention is not limited to the configuration. It is also possible to use an insertion substrate 12 including no injection hole 13 and fix the insertion substrate 12 and the semiconductor device 1 by the following method. The semiconductor device 1 is disposed on the substrate in a manner similar to the above-described method and an adhesive is applied on the semiconductor device 1. Subsequently, the insertion substrate 12 is disposed. The adhesive comes into contact with the top face of the recess 21 and is finally set so as to fix the insertion substrate 12 and the semiconductor device 1. The adhesive in this case may be, for example, a liquid adhesive or a solid one such as a sheet type.

The insertion substrate is not limited to the above but an insertion substrate as shown in FIG. 25 may be used. In the configuration, the two substrates 2a and 2j (and 2b and 2k) are stacked in the thickness direction via an insulating layer 16. In the configuration of FIG. 25, for example, the substrates 2a and 2k may be connected to the power supply line and the substrates 2j and 2b may be connected to the ground line. Naturally, such a stack-type configuration can be also applied to insertion substrates of other shapes (for example, refer to FIG. 3).

FIGS. 26 and 27 show further another example of the stack-type configuration. In a semiconductor package 58 of FIGS. 26 and 27, a plate-shaped insertion substrate 2l and a frame-shaped insertion substrate 2m are stacked via the insulating layer 16. The insertion plate 21 is connected to the ground line in the wiring pattern 7 via the conductor bumps 34 on the top face side of the package. The insertion plate 2m is connected to the power supply line in the wiring pattern 7 via the conductor bumps 34 on the under face side of the package. The insulating layer 16 may be an adhesive layer.

If an adhesive with elasticity to some extent in a solidified state is used, the adhesive layer functions as a stress relaxation layer. Therefore, the package 58 becomes more resistant to damaging when an external force is received. Such a configuration is particularly advantageous in the case where the package size is large and the mounting reliability deteriorates.

In the case where the insertion substrates 2l and 2m stacked as described above are connected to different polarities, the decoupling capacitor 19 may be disposed between the insertion substrates 2l and 2m (concretely, on the side faces of the insertion substrates) as shown in FIG. 28. By disposing the decoupling capacitor 19 on the side faces of the insertion substrates, high-density mounting can be realized. In the case of disposing the decoupling capacitor, preferably, an insulating material is supplied so as to cover a part or all of the capacitor, and no bent part is formed in the wiring pattern in the interposer substrate.

In the case where it is desired to enhance the ground line, the insertion substrate 2*l* may be connected to the ground line, and the other insertion substrate 2*m* may be connected to the power supply line. In the case where it is desired to enhance the power supply, the insertion substrate 2*l* may be connected to the power supply line, and the insertion substrate 2 may be connected to the ground line.

Naturally, the configuration of FIGS. 26 and 27 can be also combined with any of the other embodiments described above. For example, the substrate 2*m* may be divided into two parts. Further, the substrates 2*l* and 2*m* may be divided (refer to the configurations of FIGS. 7 to 9). Naturally, a plurality of semiconductor devices may be disposed in a housing part (the "housing part" is constructed by the substrates 2*l* and 2*m*), or a resin may be filled around the semiconductor device (refer to the configuration of FIG. 24). In this case, the injection port 13 (refer to FIG. 16) for filling a resin is formed in the substrate 2*l*.

EXAMPLES

Referring to the drawings, the present invention will be described more specifically on the basis of the exemplary embodiments of the present invention below. However, the invention is not limited to the following examples as long as it does not depart from the scope of the invention.

First Example 1

As a first example, the semiconductor package 51A of the second exemplary embodiment (refer to FIG. 7A) was manufactured.

As the semiconductor device 1, one high-speed DRAM with outer dimensions 9 mm×11 mm and a thickness of 150 μm was used. The thickness of the DRAM was adjusted by polishing process, and Au-stuffed bumps (corresponding to the conductor bumps 34 in FIG. 2) were formed on the DRAM electrode pads.

As the interposer substrate, a single-layer interposer substrate 5 was used. Concretely, a single-layer substrate as shown in FIG. 22D was manufactured by the process as described with reference to FIG. 22. As a single-sided tape, a tape obtained by forming a Cu film (7) with a thickness of 12 μm on a thermo-setting polyimide layer (6) with a thickness of 25 μm was prepared. The Cu film was patterned, thereby forming the wiring pattern 7.

For formation of the hole 6*h* for mounting the solder ball 10, laser process using a carbon dioxide laser was used. A desmear process was performed on the substrate in which the hole was formed, and an Ni (thickness of 2 μm)/Au (thickness of 0.5 μm) film was formed on the surface of Cu by electrolytic plating. As the second resin layer 6', a thermoplastic polyimide sheet with a thickness of 25 μm was prepared and bonded by a vacuum press method, thereby completing the interposer substrate 5.

Subsequently, the manufactured interposer substrate 5 and the DRAM chip (1) were bonded to each other (Au—Au bonding) by using an ultrasonic flip chip mounter. Concretely, the hole 6*h*' was not formed in the thermo-plastic polyimide (resin layer 6', refer to FIG. 22). The interposer substrate 5 was fixed by vacuum adsorption on a heater stage of a flip-chip mounter heated to a temperature (about 150° C.) at which the thermo-plastic polyimide is softened and the adhesive force is expressed. With the configuration, the thermo-plastic polyimide layer (6') was softened, and the Au-stuffed bumps stick to the polyimide layer, thereby realizing Au—Au bonding. By using such a process, the flip-chip connection and sealing around the Au bumps can be simultaneously performed.

The flip-chip connecting process and the resin sealing process were performed simultaneously for about five seconds. Generally, in a semiconductor package using the flip-chip mounting process, a process of sealing the periphery of the conductive bumps 4 with an epoxy-based thermo-setting resin (so-called underfill resin) is necessary. It may take about one to two hours for setting of the resin. However, in the present example, a thermo-setting resin is not used but a thermoplastic resin is used, thereby largely reducing the manufacture tact. In the first example, the whole circuit face of the DRAM chip is bonded to the thermoplastic polyimide layer (6') in the interposer substrate 5.

As the insertion substrate 2, two U-shaped insertion substrates 2*a* and 2*b* as shown in FIG. 7A were used. As each of the insertion substrates 2*a* and 2*b*, a plate member made of Cu and having a thickness of 150 μm was used. An Ni (thickness of 2 μm)/Au (thickness of 0.5 μm) film was preliminarily formed on the surface of the insertion substrates by electrolytic plating. On the Au plated film, Au-stuffed bumps 35 were formed by an Au bump bonder.

Subsequently, the Cu substrates 2*a* and 2*b* on which the Au-stuffed bumps 34 are formed in advance were connected to the ground line and the power supply line of the interposer substrate 5 by using an ultrasonic flip chip mounter.

Finally, both ends of the interposer substrate 5 are bent on the top face of the package and bonded to the semiconductor device 1 and the insertion substrates 2*a* and 2*b*, thereby completing the semiconductor package 52 of the present example.

As described above, in the conventional semiconductor package, the interposer substrate 5 has a two-layer or three-layer structure. One of the layers has to be used as the ground and/or the power supply. There is consequently a problem such that the cost of the interposer substrate 5 is high. In contrast, in the semiconductor package of the present invention, by using the cheap interposer substrate 5 with a single wiring layer and the cheap insertion substrate 2, enhancement of the ground line or the power supply line can be realized. Thus, a semiconductor package at lower cost can be realized.

In the example using the conductor plate as the insertion substrate in the conventional semiconductor package disclosed in the patent document 1, the conductor plate and the ground line or the power supply line are not connected to each other, and the conductor plate is electrically floated. Consequently, there is a problem such that the voltage fluctuates largely (in the case of a DRAM with an operation voltage of 1.8V and an operation frequency of 1 GHz used for the present example, voltage regulation $\Delta V/V=10\%$ to 20%). In contrast, in the configuration of the present example, since the insertion substrate is connected to the ground line and the power supply line, the fluctuation in the voltage can be suppressed ($\Delta V/V=$ about 5%).

In the first example, the substrate with the one-layer wiring is used as the interposer substrate 5. In the case such that a larger number of wires including an electroplated lead have to be provided between the electrode pads 9 on which the solder balls 10 are mounted, or in the case such that the pitches of the electrode pads have to be narrowed, it may be impossible to draw the wires using the one-layer wiring substrate. In such a case, a two-layer interposer substrate as shown in FIG. 10 may be used. However, in the case where the present invention is not employed, a multilayer wiring substrate with at least three wiring layers is necessary. Obviously, the manufacturing cost is higher than that of the semiconductor package of the present invention.

Second Example

As a second example, the electronic device package 53A of the fourth exemplary embodiment type (refer to FIG. 11A) was manufactured.

As the electronic device 1, total two chips were used. The two chips were a SAW device (Surface Acoustic Wave device 1A) with a plane shape of 1.3 mm×1.0 mm and a thickness of 300 µm and an LSI (1B) for wireless communication with outer dimensions of 3.2 mm×2.7 mm and a thickness of 300 µm. On electrode pads of each of the chips, Au-stuffed bumps (34) were formed by an Au bump bonder.

As the interposer substrate, a multilayer (two-layer) interposer substrate 15 was used. Concretely, in the interposer substrate of the present example, wiring patterns 7 and 8 (refer to FIG. 11) made of Cu foil with a thickness of 12 µm were formed on both sides of a polyimide layer 6 with the thickness of 25 µm (the same as that in the first example). The wiring patterns 7 and 8 were connected to each other through via holes extending so as to penetrate the polyimide layer. On each of the wiring patterns 7 and 8, a thermoplastic polyimide sheet with a thickness of 25 µm was stacked, thereby insulating the wiring patterns.

Connection between the interposer substrate 5 and the SAW device (1A) and connection between the interposer substrate 5 and the LSI (1B) for wireless communication were performed in a manner similar to the first example.

As the insertion substrate 2, a substrate in which one opening 11 is formed as shown in FIGS. 3 and 12 was prepared. The size of the opening 11 was set to a size (3.3 mm×3.8 mm) in which the SAW device and the LSI for wireless communication are housed. The material of the insertion substrate 2 was Cu like in the first example and the thickness was set to 300 µm.

With respect to process on edges of the insertion substrate 2, a C face of 90 µm was formed to each of four edges at which the interposer substrate is bent as shown in FIG. 6B. As an example of a method of forming the C face, in the present example, V-shaped notches were formed in cut positions from both sides before a plate as the base of the insertion substrate is cut out in predetermined dimensions, and the C face was formed.

In the present example, by forming the C face, the curvature was lowered by setting the bending angle of 90° to 135°. By further increasing the corners, the curvature can be further lowered. Alternately, an R face may be formed. Methods of forming an R face include a method of changing the shape of the insertion substrate 2 by wire electric discharge process or the like and a method of supplying a resin, solder, or the like to a side face of the insertion substrate, heating and melting the resin, solder, or the like, and forming a curved surface by the surface tension. In the case where the material of the insertion substrate is not easily wet by a solder, a non-electrolytic plating of Ni/Au is performed and then the solder is supplied. In such a manner, excellent wettability can be obtained. As a method of supplying the resin or solder, the resin or solder is supplied in a sheet state. In this manner, the supply amount can be made more stable, the shape of a projection can be controlled, and a terminal pitch of the bent back side can be obtained stably. The present invention is not limited to the C-face manufacturing method. The manufacturing method can be properly selected in view of manufacture dimension precision, repetition stability, cost, and the like.

By forming the C face or R face at the edge of the insertion substrate 2, the stress concentration degree after bending is decreased. Thus, reliability can be improved, and the effect of suppressing reflection of an electric signal in the bent part and loss of a transmission signal are also produced.

To verify the effect of reflection reduction using the present example, an S parameter of a wire in each of the structures was measured. As a result, loss in strength of a signal at 10 GHz was reduced by about 1 dB in the case of the C face (90 µm) and by about 1.2 dB in the case of the R face (radius of 100 µm) with respect to that in the case where edge process is not performed. Therefore, it can be said that the R face is the shape minimizing the signal loss.

On the surface of the Cu substrate (2), an Ni (thickness of 2 µm)/Au (thickness of 0.5 µm) film was preliminarily formed by electrolytic plating in a manner similar to the first example. On the Au plating film, like the first example, the Au-stuffed bumps 35 were formed by an Au bump bonder. The Au-stuffed bump is formed in a position where it is connected to the ground line in the interposer substrate 5, thereby connecting the Cu substrate (insertion substrate) 2 to the ground.

The outer dimensions of the final outer shape of the electronic device package 53A were about 8 mm×9 mm, and the height was 0.8 mm. The number of external terminals of the package 53A was 40, and the BGA land pitch was 1.0 mm.

In the semiconductor package of the conventional structure, the interposer substrate 5 has a three-layer wiring structure, and one layer has to be dedicated as a ground layer. The package has therefore a problem such that the cost of the interposer substrate 5 is high. Since the electronic device package shown in the second example of the present invention obtained as described above can be realized by using the interposer substrate 5 with the two-layer structure cheaper than the three-layer structure and the cheap insertion substrate 2, a lower-cost electronic device package can be realized.

Third Example

As a third example, the semiconductor package 54B of the fifth exemplary embodiment type (refer to FIG. 14B) was fabricated.

As the semiconductor device 1, in a manner similar to the first example, one high-speed DRAM with a plane shape of 9 mm×11 mm and a thickness of 150 µm was used. As the interposer substrate, a two-layer interposer substrate 15 which is the same as that in the second example was used.

The semiconductor package of the present example can be assembled basically in a manner similar to the first and second examples but is different in the point that the Au-stuffed bumps (34) are formed on both top and under faces of the Cu substrate (2). Formation of the bumps 34 on both sides of the insertion substrate can be realized by a conventionally known method. The bumps 34 on the top face of the insertion substrate 2 and the wiring pattern (ground line) in the interposer substrate 15 were connected at the same time as the bent substrate 15 is bonded to the top face of the semiconductor device 1.

In such a manner, the semiconductor package 54B in which the top and under faces of the insertion substrate 2 are connected to the ground line of the interposer substrate via the bumps 34 was fabricated. The number of connections to the ground line in the semiconductor package 54B of the third example is larger than that of each of the semiconductor packages of the first and second examples, reliability is higher. To be concrete, the reliability of the connection between the Au bumps 34 and the ground line was improved.

Fourth Example

As a fourth example, the semiconductor package 56 of the seventh exemplary embodiment type (refer to FIG. 18) was fabricated.

As the semiconductor device 1, one CPU with a plane shape of 7 mm×7 mm and a thickness of 150 μm was used. As the insertion substrate, like the first example, U-shaped insertion substrates 2a and 2b each made by a plate member made of Cu and having a thickness of 150 μm were used. The insertion substrates are the same as those in the second example in the point that the one insertion substrate 2a is connected to the ground line, and the other insertion substrate 2b is connected to the power supply line.

As the decoupling capacitor 19, a multilayer ceramic chip capacitor with a plane shape of 1.6 mm×0.8 mm and a thickness of 0.5 mm was used. The number of capacitors was six, and electrostatic capacity of each of the capacitors is 1.0 μF.

Since assembly of the semiconductor package 56 of the present example is the same as that in the foregoing example partway, the description will not be repeated. The capacitors were mounted after the interposer substrate 5 was bent and bonded on the Cu substrate. Concretely, first, an Sn—Ag—Cu solder paste was applied on external electrodes of the capacitors by using a surface mounter. Each of the capacitors 19 was disposed across the insertion substrates 2a and 2b. By using a reflow furnace, the Sn—Ag—Cu solder was melted to connect the capacitors and the Cu substrate.

In such a manner, the semiconductor package 56 in which six decoupling capacitors 19 are disposed was fabricated. Since the decoupling capacitors 19 are provided, the semiconductor package of the present example is more resistant to switching noise as compared with the configurations of the above-described examples.

Further, in the present fourth example, the fabricated semiconductor package 56 was mounted on a DRAM module such as a server or a personal computer. As a result, the module could be further miniaturized. Similarly, the semiconductor package 56 was mounted on an electronic device such as a notebook-sized personal computer or a PDA (Personal Digital Assistance). As a result, miniaturization of the device was achieved.

Fifth Example

As a fifth example, the semiconductor package 57C of the eighth exemplary embodiment type (refer to FIG. 20C) was fabricated. Specifically, the semiconductor package 52 of the second exemplary embodiment type (the configuration using the multilayer interposer substrate, refer to FIG. 10) was fabricated, and the conventional semiconductor package 65 was mounted on the package.

In the semiconductor package 52, a CPU with a plane shape of 7 mm×7 mm and a thickness of 150 μm was used as the semiconductor device 1.

As the conventional semiconductor package 65, a commercially-available DRAM package (obtained by connecting a DRAM to the interposer substrate by a method such as wire bonding or TAB and sealing the resultant with a mold resin, having a plane shape of 13.5 mm×12 mm) was prepared. The final plane shape of the semiconductor package 57C of a CPU/DRAM mixed type of the present example is 14 mm×14 mm.

A concrete method of stacking two semiconductor packages is as follows. The DRAM package 65 preliminarily provided with the solder balls 10 was fixed on the stage of a flip-chip mounter by vacuum adsorption so that the solder balls 10 side is positioned upward. After that, a flux was applied on the solder balls 10. The semiconductor package 52 on which the CPU is mounted was disposed on the absorbed and held DRAM package 65 while performing positioning so that external terminals (refer to the external terminals provided on the top face side in FIG. 20C) of the package and the solder balls 10 are aligned. The positioning was performed using a camera of the flip-chip mounter so that the center of the external terminal and the center of the solder ball 10 were aligned. Subsequently, without performing heating, both of them were temporarily adhered with a flux by the flip-chip mounter. The two semiconductor packages temporarily bonded were put in a reflow furnace to melt the solder, thereby finally connecting the packages.

In such a manner, a system-in-package (SiP) type semiconductor package 57C in which a DRAM and a CPU are stacked was obtained. When such an SiP was mounted on an electronic device such as a cellular phone or a digital camera, the electronic device was miniaturized.

BRIEF DESCRIPTION OF THE DRAWINGS

FIG. 1 is a vertical section showing the configuration of a conventional semiconductor package.

FIG. 2 is a vertical section showing the configuration of a semiconductor package of a first exemplary embodiment.

FIG. 3 is a top view of the semiconductor package of FIG. 2, showing only a semiconductor device and an insertion substrate.

FIG. 6 are enlarged vertical sections of bent parts of interposer substrates showing some examples of insertion substrates in the first exemplary embodiment.

FIG. 11 are vertical sections each showing the configuration of a semiconductor package of a fourth exemplary embodiment.

FIG. 12 is a top view of the semiconductor package of FIG. 11, showing only a semiconductor device and an insertion substrate.

FIG. 14 are vertical sections each showing the configuration of a semiconductor package of a fifth exemplary embodiment.

FIG. 15 is a vertical section showing the configuration of a semiconductor package of a sixth exemplary embodiment.

FIG. 16 is a perspective view showing an insertion substrate and a semiconductor device in the semiconductor package of FIG. 13, viewed from under face side.

FIG. 17 is a perspective view showing another configuration example of the sixth exemplary embodiment.

FIG. 18A is a top view and FIG. 18B is a vertical section.

FIG. 20 are vertical sections showing the configuration of a semiconductor package of an eighth exemplary embodiment.

FIG. 21 is a diagram schematically showing an example of a semiconductor package in which the packages of the second exemplary embodiment are stacked.

FIG. 25 is a perspective view showing further another configuration example of the insertion substrate.

FIG. 26 is a vertical section showing further another configuration example of the insertion substrate.

FIG. 27 is a perspective view showing two insertion substrates illustrated in FIG. 26.

FIG. 28 is a vertical section showing an example of adding a decoupling capacitor to the configuration of FIG. 27.

Figure 4:
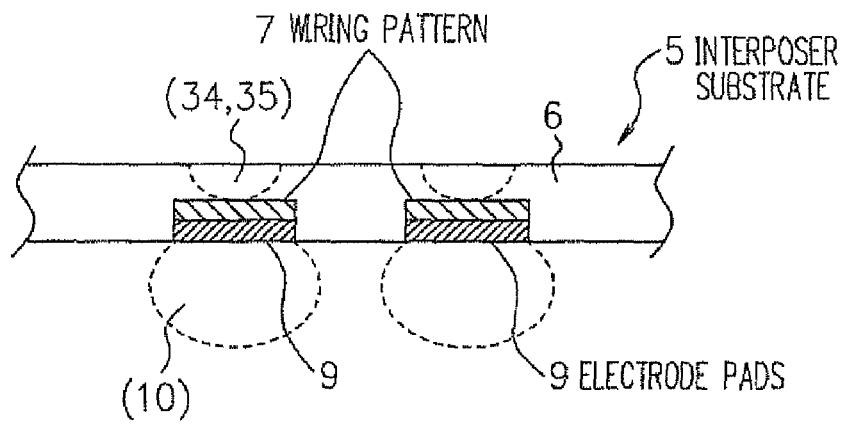
FIG. 4 is a cross section showing the configuration of an interposer substrate.
Figure 5:
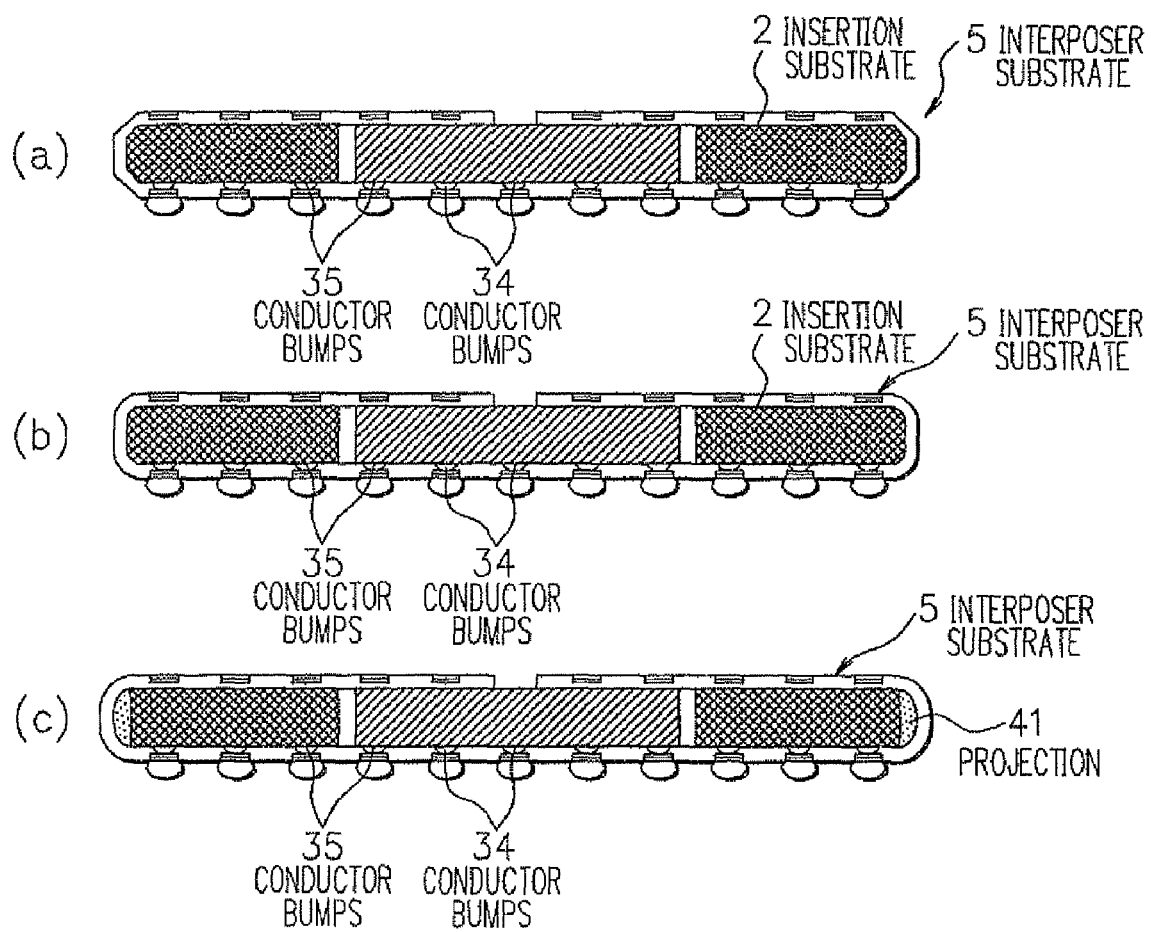
FIG. 5 are vertical sections of entire packages showing some examples of insertion substrates in the first exemplary embodiment.
Figure 7:
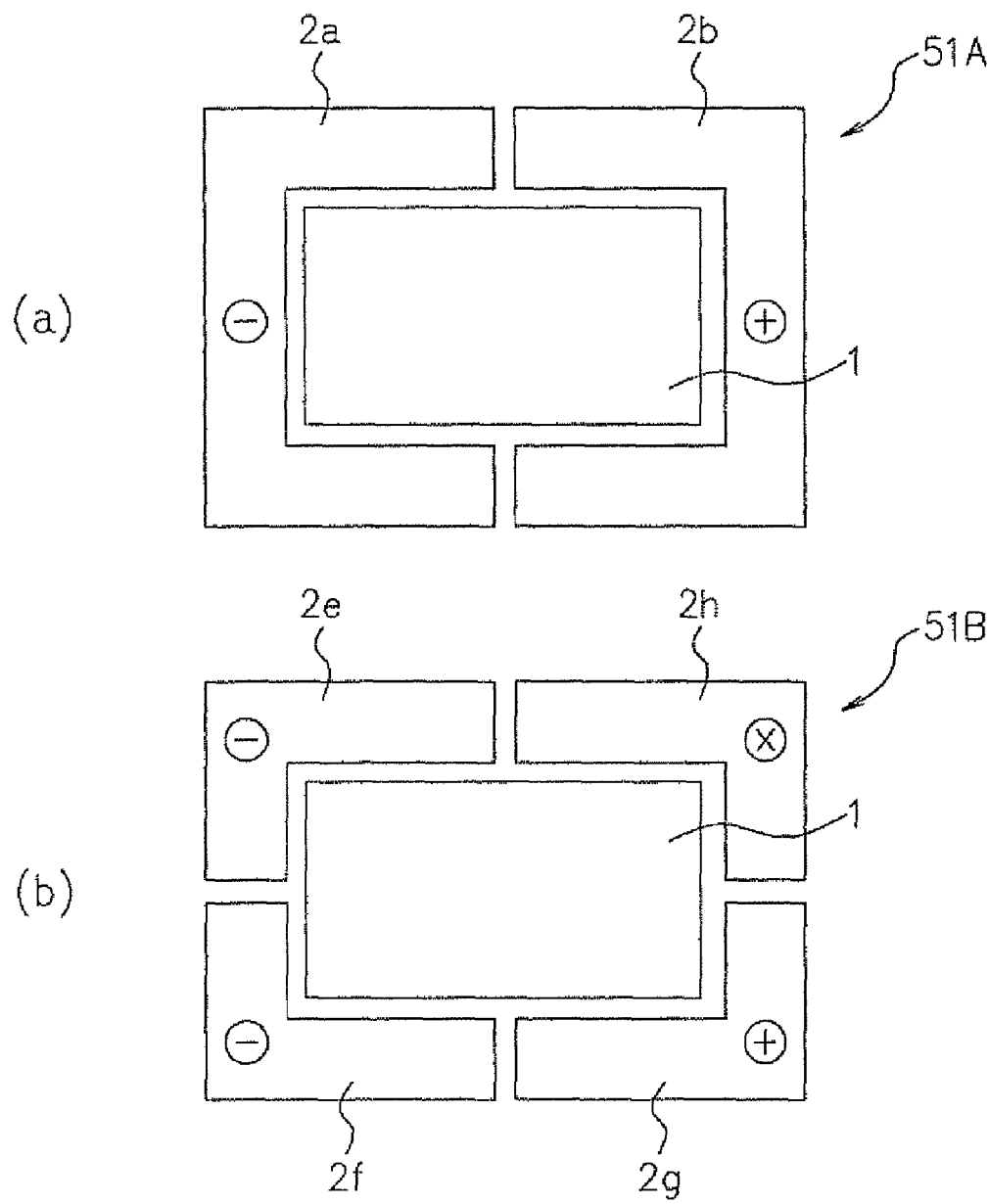
FIG. 7 are top views showing the configurations of a second exemplary embodiment, as examples of insertion substrates.
Figure 8:
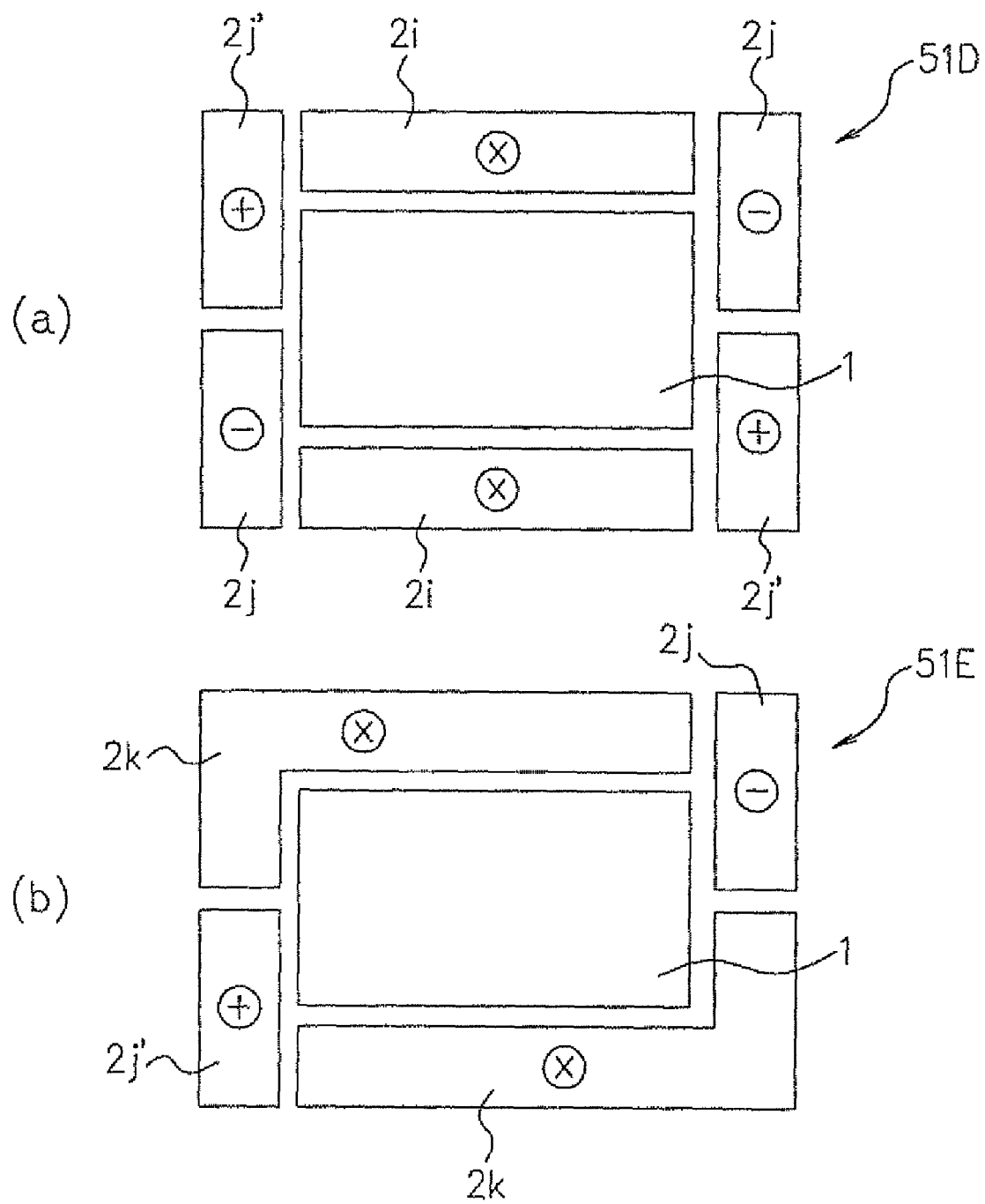
FIG. 8 are top views showing other configuration examples of the second exemplary embodiment.
Figure 9:
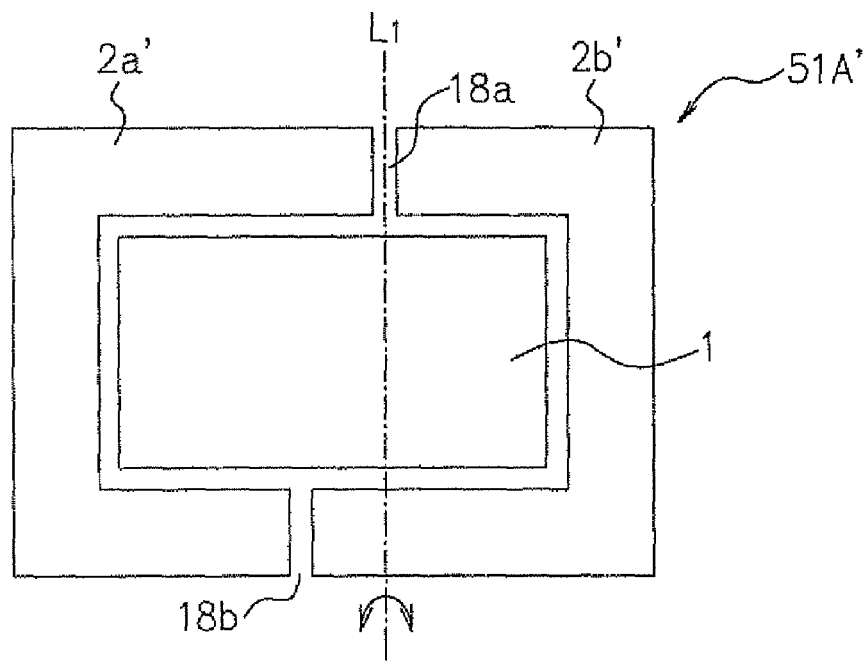
FIG. 9 is a top view showing a configuration obtained by changing the configuration of FIG. 7A.
Figure 10:
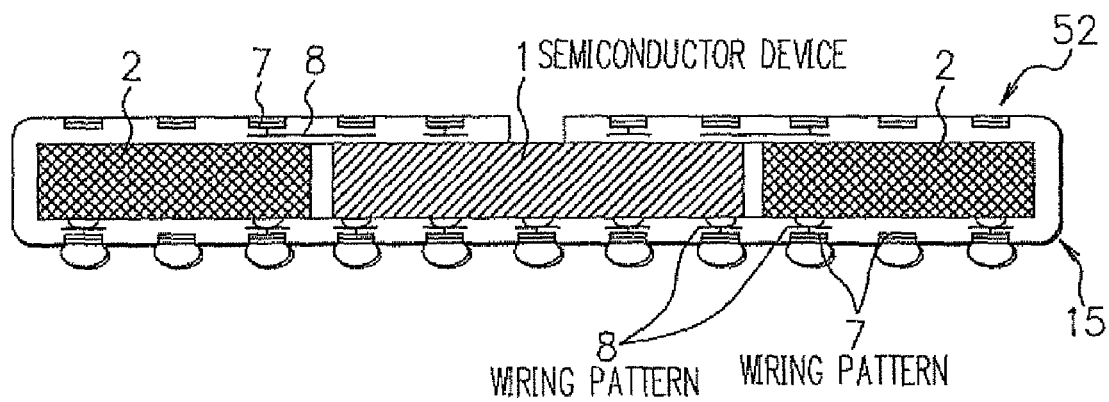
FIG. 10 is a vertical section showing the configuration of a semiconductor package of a third exemplary embodiment.
Figure 13:
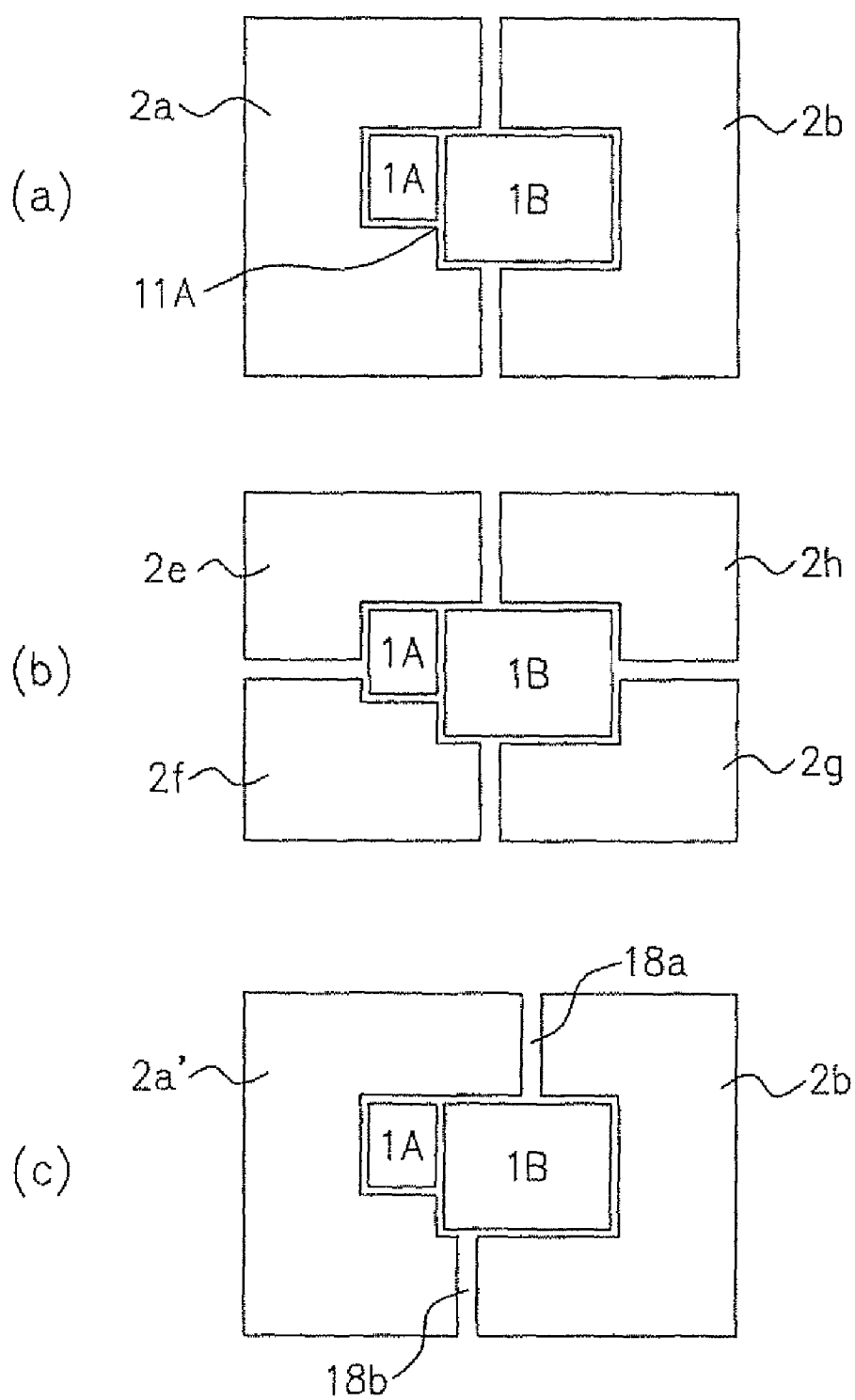
FIG. 13 are top views for explaining other configuration examples of the fourth exemplary embodiment.
Figure 18:
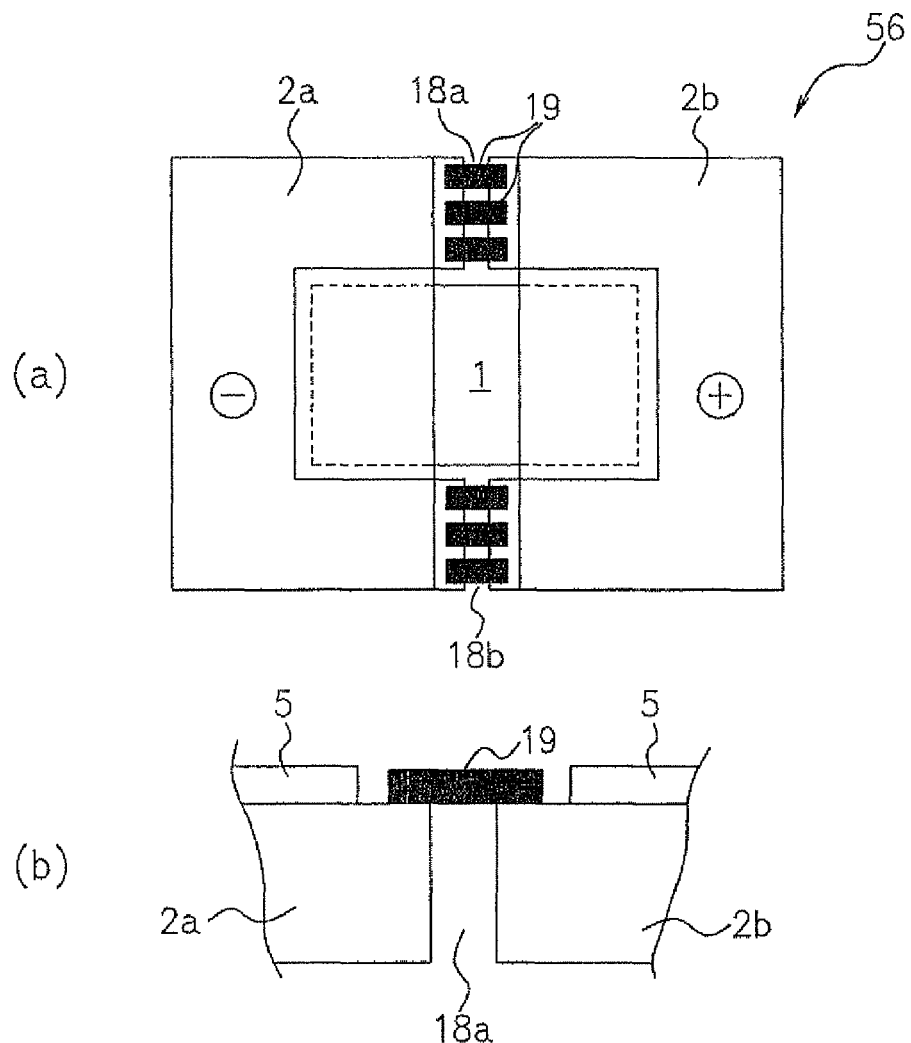
FIG. 18 are views showing the configuration of a semiconductor package of a seventh exemplary embodiment.
Figure 19:
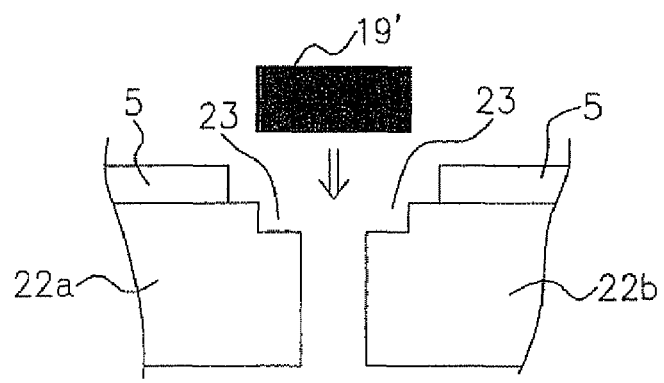
FIG. 19 is a vertical section showing another configuration example of the seventh exemplary embodiment.
Figure 22:
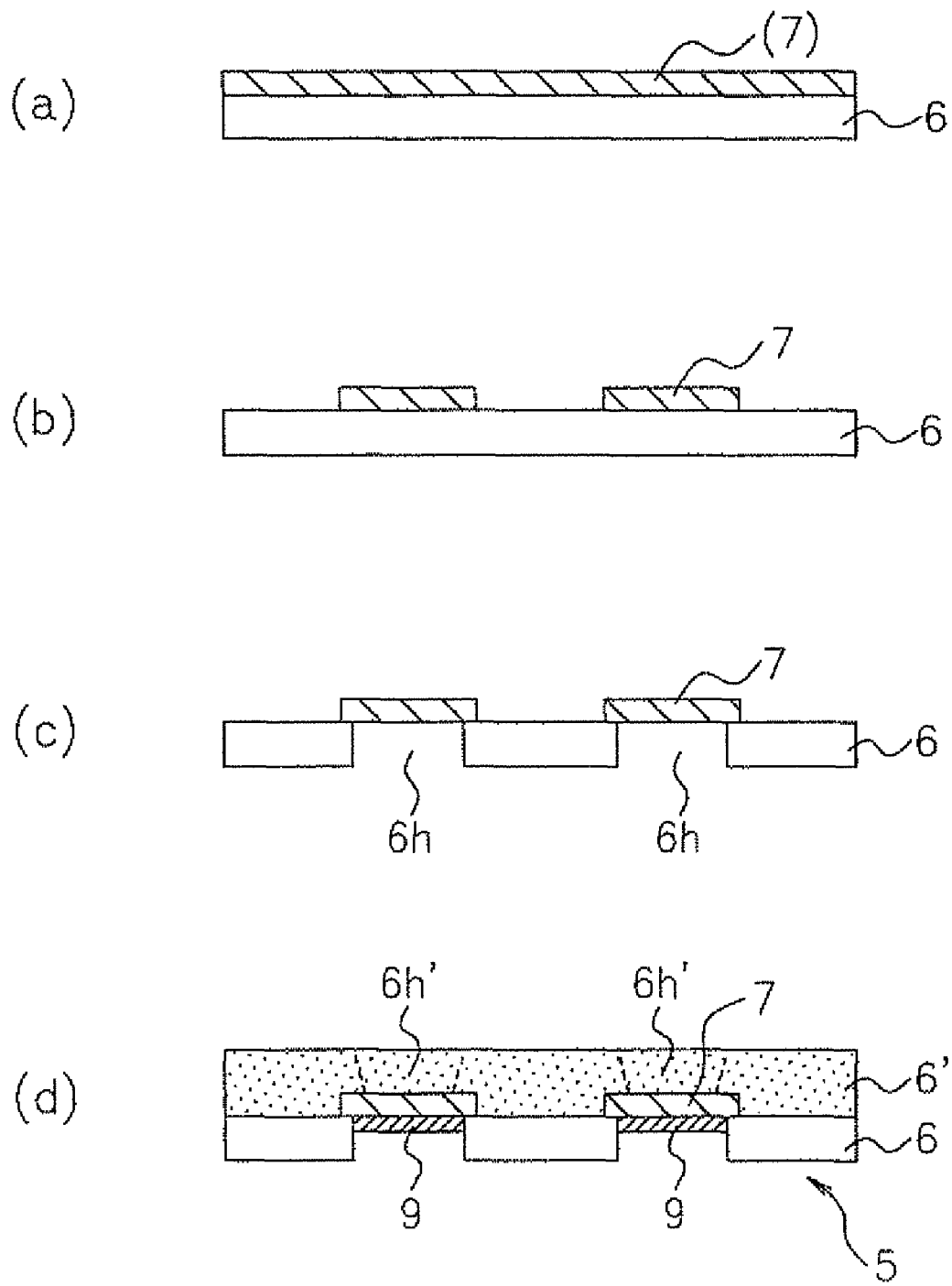
FIG. 22 are diagrams showing an example of the configuration and a manufacturing method of the interposer substrate.
Figure 23:
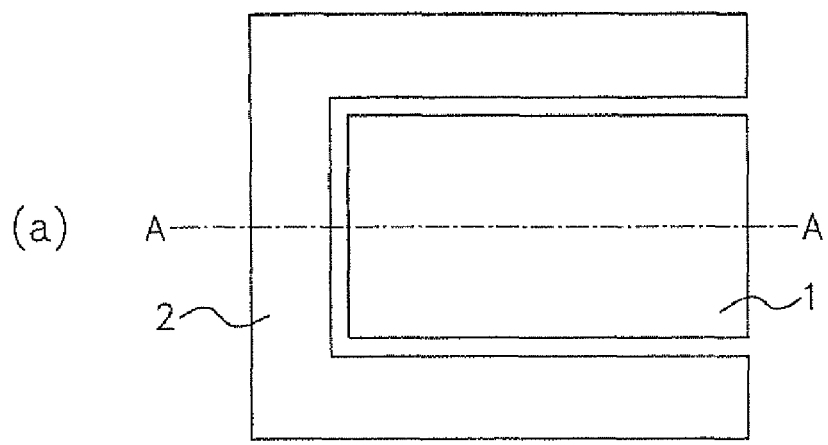
FIG. 23 are diagrams showing the configuration in which a part of the interposer substrate is bent along the outer surface of the semiconductor device.
Figure 24:
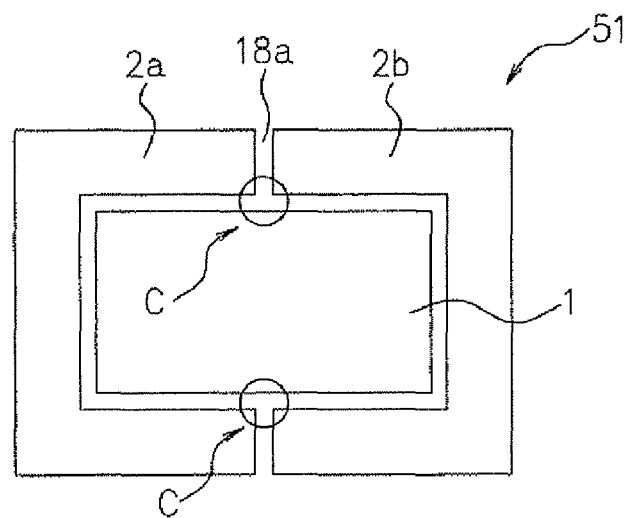
FIG. 24 is a top view showing an example of applying an adhesive for fixing a semiconductor device and an insertion substrate.

DESCRIPTION OF REFERENCE NUMERALS 1, 1', 1A, 1B semiconductor device
2, 12, 22 insertion substrate
5, 15 interposer substrate
6 thermoplastic resin
7, 8 wiring pattern
9 electrode pad
10 solder ball
11, 11A opening
13 injection hole
16 insulating layer
17a, 17b substrate end
18a to 18d gap
19, 19' decoupling capacitor
21, 21' cavity
23 step
34, 35 conductor bump
40 edge
41 projection
50 to 58 semiconductor package (electronic device packages)

The invention claimed is:

1. An electronic device package comprising:
an electronic device including a circuit face on which an external electrode is formed;
at least two insertion substrates stacked via an insulating layer in a thickness direction of the at least two insertion substrates, for forming a housing part in which the electronic device are disposed; and
a flexible substrate including a wiring pattern electrically connected to the electronic device and at least part of the flexible substrate is bent along the insertion substrate and/or the electronic device,
wherein at least one of the insertion substrates is made of a conductive material and is electrically connected to a ground line or a power supply line in the wiring pattern,
wherein at least one of the at least two insertion substrates include a plurality of substrates disposed side-by-side, and
wherein gaps formed between ends of the plurality of insertion substrates are not aligned on a straight line in plan view.

2. The electronic device package according to claim 1, wherein a stack body in which the at least two insertion substrates are stacked in the thickness direction is disposed flatways on a plane parallel with the circuit face.

3. The electronic device package according to claim 1, wherein one of the plurality of insertion substrates is connected to the ground line and another one of the plurality of insertion substrates is connected to the power supply line.

4. The electronic device package according to claim 1, wherein a decoupling capacitor is disposed between one of the plurality of insertion substrates connected to the ground line and another one of the plurality of insertion substrates connected to the power supply line.

5. The electronic device package according to claim 1, wherein the housing part is formed in a through hole shape.

6. The electronic device package according to claim 5, wherein thickness of the at least two insertion substrates and thickness of the electronic device are the same.

7. The electronic device package according to claim 1, wherein the housing part is formed as a recess shape.

8. The electronic device package according to claim 1, wherein the at least two insertion substrates and the wiring pattern are electrically connected to each other on both sides of the at least two insertion substrates.

9. The electronic device package according to claim 1, wherein the at least two insertion substrates and the wiring pattern are electrically connected to each other via a conductor bump.

10. The electronic device package according to claim 1, wherein the flexible substrate is a multilayer substrate in which two or more wiring patterns are formed.

11. The electronic device package according to claim 1, wherein at least a part of an inner face that is in contact with the at least two insertion substrates and/or the electronic device, of the flexible substrate is made of a thermoplastic resin.

12. The electronic device package according to claim 1, wherein at least one insertion substrate that is not connected to any of the power supply line and the ground line is provided.

13. The electronic device package according to claim 1, wherein the bent part of the flexible substrate has a polygonal shape or a circular shape.

14. The electronic device package according to claim 1, wherein a projection is formed to correspond to the bent part of the flexible substrate on the at least two insertion substrates, thereby eliminating the bent part or reducing the degree of bending.

15. An electronic device package obtained by stacking a plurality of the electronic device packages of the same kind according to any one of claims 1, 2-4, 5-9 and 10-14 or a plurality of the electronic device packages of different kinds selected from the electronic device packages according to claims 1, 2-4, 5-9 and 10-14.

16. An electronic device package obtained by stacking a plurality of electronic devices, including at least one electronic device package according to claim 1.

17. A module in which the electronic device package according to claim 1 is disposed on a mounting board.

18. An electronic device on which the module of claim 17 is mounted.

19. The electronic device package according to claim 1, wherein a plurality of electronic devices is disposed side by side in the housing part.

20. A electronic device package comprising: an electronic device including circuit face on which an external electrode is formed; at least two insertion substrates forming a housing part in which the electronic device is disposed; and a flexible substrate including a wiring pattern electrically connected to the electronic device, at least a part of the flexible substrate is bent along the at least one insertion substrate and/or the electronic device, wherein at least one of the insertion substrates is made of a conductive material and is electrically connected to a ground line or a power supply line in the wiring pattern, wherein the at least two insertion substrates are disposed side-by-side flatways on a plane parallel with the circuit face, and wherein gaps formed between ends of the at least two insertion substrates are not aligned on a straight line in plan view.

21. An electronic device package comprising:
- an electronic device including a circuit face on which an external electrode is formed;
- at least one insertion substrate forming a housing part in which the electronic device is disposed; and
- a flexible substrate including a wiring pattern electronically connected to the electronic device, at least a part of the flexible substrate is bent along the at least one insertion substrate and/or the electronic device,
- wherein at least one of the insertion substrates is made of a conductive material and is electrically connected to a ground line or a power supply line in the wiring pattern,
- wherein the at least one insertion substrate and the wiring pattern are electrically connected to each other on both sides of the at least one insertion substrate,
- wherein said at least one insertion substrate includes a plurality of substrates disposed side-by-side, and
- wherein gaps formed between ends of the plurality of insertion substrates are not aligned on a straight line in plan view.

22. The electronic device package according to claim 1, wherein a gap is provided between the electronic device and one of the at least two insertion substrates.

23. The electronic device package according to claim 1, wherein one of the at least two insertion substrates is a plate-shaped insertion substrates and another of the at least two insertion substrates is a frame-shaped insertion substrates.

24. The electronic device package according to claim 1, wherein an insulating adhesive is applied either between the electronic device and the at least two insertion substrates or between the at least two insertion substrates disposed side-by-side.

25. The electronic device package according to claim 1, wherein a stack body in which the at least two insertion substrates are stacked in the thickness direction is electrically connected to the wiring pattern via a conductive adhesive.

26. The electronic device package according to claim 4, wherein the decoupling capacitor is disposed on a respective side face of the at least two insertion substrates.

* * * * *